(12) United States Patent
Cheng et al.

(10) Patent No.: US 8,623,458 B2
(45) Date of Patent: Jan. 7, 2014

(54) METHODS OF DIRECTED SELF-ASSEMBLY, AND LAYERED STRUCTURES FORMED THEREFROM

(75) Inventors: Joy Cheng, San Jose, CA (US);
Matthew E. Colburn, Schenectady, NY (US); Stefan Harrer, New York City, NY (US); William D. Hinsberg, Fremont, CA (US); Steven J. Holmes, Guilderland, NY (US); Ho-Cheol Kim, San Jose, CA (US); Daniel Paul Sanders, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1042 days.

(21) Appl. No.: 12/642,018

(22) Filed: Dec. 18, 2009

(65) Prior Publication Data

US 2011/0147984 A1    Jun. 23, 2011

(51) Int. Cl.
*B81C 1/00* (2006.01)
*C08J 5/18* (2006.01)
*C08J 5/00* (2006.01)

(52) U.S. Cl.
USPC ........... 427/259; 427/256; 427/258; 427/261; 427/264; 427/265; 427/270; 427/271; 427/272; 427/282; 427/58; 427/96.1; 427/97.1; 427/98.4; 430/311; 430/312; 430/313; 430/322; 430/325

(58) Field of Classification Search
None
See application file for complete search history.

(56) References Cited

U.S. PATENT DOCUMENTS

| | | | |
|---|---|---|---|
| 6,746,825 B2 | 6/2004 | Nealey et al. | |
| 6,900,001 B2 | 5/2005 | Livesay et al. | |
| 6,926,953 B2 | 8/2005 | Nealey et al. | |
| 7,008,757 B2 | 3/2006 | Reichmanis et al. | |
| 7,090,783 B1 | 8/2006 | Cui et al. | |
| 7,347,953 B2 | 3/2008 | Black et al. | |

(Continued)

FOREIGN PATENT DOCUMENTS

| | | |
|---|---|---|
| JP | 2001343757 | 12/2001 |
| WO | 2008097736 A2 | 8/2008 |

OTHER PUBLICATIONS

Jeong et al., "Soft Graphoepitaxy of Block Copolymer Assembly with Disposable Photoresist Confinement", Nano Letters, vol. 9 No. 6, (May 7, 2009), pp. 2300-2305.*

(Continued)

*Primary Examiner* — Michael Cleveland
*Assistant Examiner* — Lisha Jiang
(74) *Attorney, Agent, or Firm* — Michael R. Roberts

(57) ABSTRACT

A layered structure comprising a self-assembled material is formed by a method that includes forming a photochemically, thermally and/or chemically treated patterned photoresist layer disposed on a first surface of a substrate. The treated patterned photoresist layer comprises a non-crosslinked treated photoresist. An orientation control material is cast on the treated patterned photoresist layer, forming a layer containing orientation control material bound to a second surface of the substrate. The treated photoresist and, optionally, any non-bound orientation control material are removed by a development process, resulting in a pre-pattern for self-assembly. A material capable of self-assembly is cast on the pre-pattern. The casted material is allowed to self-assemble with optional heating and/or annealing to produce the layered structure.

34 Claims, 25 Drawing Sheets

(56) References Cited

U.S. PATENT DOCUMENTS

| | | | |
|---|---|---|---|
| 7,521,090 | B1 | 4/2009 | Cheng et al. |
| 7,521,094 | B1 | 4/2009 | Cheng et al. |
| 2002/0128408 | A1* | 9/2002 | Goodall et al. ............... 526/171 |
| 2003/0022111 | A1* | 1/2003 | Falk et al. .................... 430/322 |
| 2003/0091752 | A1 | 5/2003 | Nealey et al. |
| 2004/0029047 | A1 | 2/2004 | Ishibashi et al. |
| 2004/0175628 | A1 | 9/2004 | Nealey et al. |
| 2005/0158988 | A1 | 7/2005 | Lee et al. |
| 2005/0227492 | A1 | 10/2005 | Hah et al. |
| 2006/0134556 | A1 | 6/2006 | Nealey et al. |
| 2007/0134420 | A1 | 6/2007 | Koberstein et al. |
| 2008/0070010 | A1 | 3/2008 | Dravid et al. |
| 2008/0085601 | A1 | 4/2008 | Park et al. |
| 2008/0148977 | A1* | 6/2008 | Sonokawa et al. ............ 101/465 |
| 2008/0193658 | A1* | 8/2008 | Millward ..................... 427/401 |
| 2008/0199814 | A1 | 8/2008 | Brzozowy et al. |
| 2009/0001045 | A1 | 1/2009 | Chen et al. |
| 2009/0035668 | A1 | 2/2009 | Breyta et al. |
| 2009/0087653 | A1 | 4/2009 | Nealey et al. |
| 2011/0052883 | A1* | 3/2011 | Jain et al. ................... 428/195.1 |

OTHER PUBLICATIONS

European Patent Office, Partial Search Report, PCT/EP2010/068318, filing date Nov. 26, 2010, mailing date Jun. 14, 2011.

Peters et al., "Combining advanced lithographic techniques and self-assembly of thin films of diblock copolymers to produce templates for nanofabrication" J. Vac. Sci. Technol. B 18, 3530-3534 (2000); Nov./Dec. 2000.

"Nanostructure engineering by templated self-assembly of block copolymers" J.Y. Cheng; A.M. Mayes; Caroline A. Ross, Nature Materials, Nov. 2004, vol. 3, pp. 823-828, Oct. 3, 2004.

"Polymer self assembly in simiconductor microelectronics" Black et al., IBM J. Res. Dev., Sep. 2007, vol. 51, pp. 605-633.

"Block copolymers and conventional lithography" M.P. Stoykovich; P.F. Nealey, Materials Today, Sep. 2006, vol. 9, pp. 20-29.

"Directed Self-Assembly of Block Copolymers for Nanolithography: Fabrication of Isolated Features and Essential Integrated Circuit Geometries" M.P. Stoykovich et al., ACS Nano, vol. 1, No. 3, pp. 168-175, (2007).

"Templated Self-Assembly of Block Copolymers: Top-Down Helps Bottom-Up" J.Y. Cheng; C.A. Ross; H.I Smith; E.L. Thomas, Adv. Materials, 2006, 18, pp. 2505-2521.

"Patterned Magnetic Media Made by Self-Assembled Block-Copolymer Lithography" C.A. Ross; J.Y. Cheng, MRS Bull., Sep. 2008, vol. 33, pp. 838-845.

"Surface patterns from block copolymer self-assembly" H.C. Kim; W.D. Hinsberg, J. Vac. Sci. Technol. A, Nov./Dec. 2008, 26, pp. 1369-1382.

* cited by examiner

Self-assembled Lines
$P_{DSA}$=25nm

METHODS OF DIRECTED SELF-ASSEMBLY, AND LAYERED STRUCTURES FORMED THEREFROM

BACKGROUND

This disclosure is related to methods of directed self-assembly, and the layered structures formed therefrom; and more specifically, to self-assembly of microdomains of block copolymers having higher spatial frequency.

The ability to pattern features with smaller critical dimensions allows denser circuitry to be fabricated, thereby enabling more circuit elements within the same area and reducing the overall cost per element. Features having smaller critical dimensions and tighter pitch are needed in each technology generation. Directed self-assembly (DSA) of polymeric materials is a potential candidate to extend current lithography by enhancing the spatial resolution and/or controlling the critical dimension variation of a predefined pattern on a substrate. In particular, DSA of block copolymer (BCP) materials and polymer blends have been explored for this purpose. There are two major approaches to the directed self-assembly of BCP thin films: graphoepitaxy and chemical epitaxy.

In the graphoepitaxy method depicted in Prior Art FIG. 1A, the self-organization of block copolymers is guided by topographical features of pre-patterned substrates. A topographically patterned substrate with sidewalls 910 having a preferential 1 affinity for one domain 914 and an underlying orientation control layer 912 can be used to direct self-assembly (of lamellar domains in this case) within the trench of width L. For example, in FIG. 1A self-aligned lamellar domains 914 and 916 of BCPs form parallel line-space patterns in topographical trenches and enhance pattern resolution by subdividing the space (trench) of the lithographically-derived topographical pre-pattern. One domain, for example domain 916, can be selectively etched leaving domain 914. With a trench of width L and BCP with a periodicity of $P_{BCP}$, frequency multiplication of a factor of $L/P_{BCP}$ can be achieved. However, graphoepitaxy has issues which potentially limit its utility as a lithographic technique. For example, in graphoepitaxy, the placement error and line-edge roughness of BCP domains are deteriorated by the imperfect topographical pre-patterns and non-uniform thickness of the BCP polymer layer coated over the topographical substrate. In addition, the mandrels 918 used to direct the self-assembly process are usually much larger than the BCP domains, and the area occupied by the mandrels is essentially wasted. Also, many graphoepitaxy approaches use topographic features formed by etching into an oxide hard mask layer to provide patterns that are stable to the BCP casting solvent. The additional process steps using the hard mask layer increase the cost and complexity of graphoepitaxy-based DSA processes.

Alternatively, in the chemical epitaxy method depicted in Prior Art FIG. 1B, the self-assembly of BCP materials to form domains 926 and 928 is directed by dense chemical patterns in a layer 920. The pitch of the chemical pattern ($P_S$) is roughly equivalent to the pitch of the BCP domain periodicity ($P_{BCP}$). The preferential affinity between at least one of the chemical pattern regions 922 or 924 and a corresponding BCP domain 926 or 928 directs the self-assembly of the BCP domains in accordance with the underlying chemical pre-pattern. Unlike graphoepitaxy, no area is lost to the features directing self-assembly. In addition, the BCP self-assembly process improves the dimensional control due to the lower critical dimension variation (both mean critical dimension and line-edge roughness (LER) or line-width roughness (LWR)) in the final self-assembled structures compared to that in the underlying chemical pre-pattern. Even though DSA using chemical epitaxy on dense chemical patterns increases critical dimension control, it does not improve resolution or provide an information gain. Current optical lithography tools do not have sufficient resolution to print these 1:1 chemical patterns. Instead, these patterns have been fabricated using lithographic techniques such as e-beam direct write or extreme-ultraviolet (EUV, 13.5 nm) interference lithography which are not suitable for volume manufacturing.

Chemical epitaxy on sparse chemical patterns, however, can provide critical dimension and orientation control similar to that on dense chemical patterns but also provide enhanced resolution. For example, Prior Art FIG. 1C shows the directed self-assembly of BCP material to form domains 936 and 938 on a sparse chemical pattern layer 930 comprised of alternating pinning regions 934 having a width $W_P=0.5*P_{BCP}$ and regions with an orientation control material 932 having a width $W_{CA}=P_S-W_P$. In the example shown in FIG. 1C, pinning regions 934 have a strong affinity for domains 938. An orientation control material such as 932 having operationally equivalent affinity for both domains 938 and domains 936 is suitable to support perpendicularly-oriented domains (936 and 938) as shown. The factor of frequency multiplication is determined by the ratio of the pitch of the sparse chemical patterns stripe ($P_S$) and the pitch of BCP ($P_{BCP}$). In FIG. 1C, the depicted ratio $P_S/P_{BCP}=2$, which would result in frequency doubling. Similarly, spatial frequency tripling could be achieved by using a sparse chemical pattern having a $P_S/P_{BCP}=3$, and so on.

While a wide variety of orientation control materials have been developed including surface-bound self-assembled monolayers, polymer brushes (i.e., the polymer chains attach at one end to an interface and extend away from the interface to form a "brush" layer), and photo- or thermally-crosslinkable polymer materials, in practice it is quite difficult to fabricate suitable sparse chemical patterns that effectively direct self-assembly of BCPs in a manner that can be integrated with conventional lithographic processes and materials. Prior Art FIGS. 2A to 2D show some of the approaches that have been used. FIG. 2A illustrates direct writing of 1:1 dense chemical patterns by e-beam direct write lithography or EUV interference lithography in an orientation control layer 940 (e.g., a surface-bound polymer brush or self-assembled monolayer). The chemical pattern generated in layer 940 directs self-assembly of a BCP to form domains 942 and 944. Although e-beam lithography can be used to make sparse chemical patterns in this manner, e-beam direct write lithography is not suitable for volume manufacturing. Alternatively, as shown in Prior Art FIG. 2B, a conventional positive-tone photoresist 946 can be patterned on top of an orientation control material 948 to form patterned photoresist features 950. The photoresist pattern can protect the underlying surface during an etch process that creates pinning regions (i.e., a region having a particular affinity for one domain of a self-assembled material), either by removing the material to uncover the underlying substrate or by inducing enough damage to the material that it becomes preferential to one of the BCP self-assembled domains 954 or 956. The protecting photoresist layer can then be removed by an organic solvent rinse leaving the etched orientation layer having features 952. However, the special orientation control material may interfere with the photoresist patterning by causing reflectivity or photoresist adhesion issues. In addition, this method is quite process intensive and involves etch processes that cannot be done in the lithography track tool. Furthermore, the protective photoresist layer may be damaged sufficiently by the etch process that it cannot be stripped cleanly and completely. Rather than selectively removing or altering an orientation control material, negative-tone photo-patternable orientation control materials 958 have been developed that can be patterned on top of conventional anti-reflective coatings 960 (Prior Art FIG. 2C). BCP self-assembled domains 962 and 964 are also shown in Prior Art FIG. 2C. In practice, while such negative-tone photo-patternable orientation control materials work well for large area patterns, no such materials have demonstrated sufficient resolution performance. Finally, as shown in Prior Art FIG. 2D, direct patterning of a crosslinking negative-tone photoresist 966 on top of an orientation control material 968 can produce pinning regions. BCP self-assembled domains 970 and 972 are also shown in Prior Art FIG. 2D. Care must be taken so as to not alter the surface properties of the orientation control material in the non-exposed regions during photoresist casting and development. In addition, it is challenging to achieve high resolution patterning using a dark field mask with the limited range of conventional negative-tone photoresists for optical lithography. The best reported efforts have used a hydrogen silsesquioxane negative-tone e-beam photoresist, which is unsuitable for volume manufacturing.

While patterning a thin positive-tone photoresist on a controlled surface seems to be the most straightforward approach to creating chemical patterns to direct self-assembly, in practice many problems are encountered that make this route unviable. For example, while patterning resists with typical thicknesses of 80 to 200 nm is suitable for the generation of topographical patterns required for graphoepitaxy, patterning high fidelity, low defect images in the thin (e.g., sub-15 nm) layers required for chemical patterns is difficult. In addition, the underlying surface must serve as both a bottom anti-reflective coating (BARC) during photoresist patterning and later as an orientation control layer in the areas cleared during patterning. However, commercially available BARCs (being optimized primarily for their optical properties, etch properties, and photoresist adhesion/profile performance) do not have the appropriate surface properties to act as orientation control materials. In addition, current orientation control materials do not have the thickness or optical properties necessary to provide adequate reflection control (especially for high numerical aperature (high-NA) optical lithography). In practice, it is quite difficult to maintain the surface properties of the underlying orientation control material through the course of conventional lithographic patterning of positive-tone photoresist. The underlying orientation control material in the exposed regions is typically subjected to the imaging radiation (e.g., damaging deep ultraviolet (DUV), extreme ultraviolet (EUV), or electron beam radiation), superacids at elevated temperatures (i.e., photo-generated acid during post-exposure bake), reactive intermediates (e.g., those from photoacid generator (PAG) decomposition, acidolysis of photoresist protecting groups, or photodecomposition of photoresist materials), and strong bases (i.e., aqueous tetramethylammonium hydroxide during photoresist development). Any and all of these can change the surface properties of the underlying orientation control material. And since the specifics and magnitude of the changes are dependent upon the lithographic exposure technique, the photoresist, and the processing conditions, it is not possible to compensate for all of these effects by manipulating the orientation control material.

Therefore, methods of generating sparse chemical patterns for directing self-assembly of a material are needed that are compatible with conventional tools, processes, and materials.

SUMMARY

Accordingly, methods of forming layered structures comprising a self-assembled material utilize a treated photoresist pattern having an orientation control material disposed thereon to prepare a sparse chemical pre-pattern. The chemical pre-pattern directs self-assembly of a material by chemical epitaxy.

In an embodiment, a method of forming a layered structure comprising a self-assembled material is disclosed, comprising:

disposing a non-crosslinking photoresist layer on a substrate; pattern-wise exposing the photoresist layer to first radiation; optionally heating the exposed photoresist layer; developing the exposed photoresist layer in a first development process with an aqueous alkaline developer, forming an initial patterned photoresist layer;

treating the initial patterned photoresist layer photochemically, thermally and/or chemically, thereby forming a treated patterned photoresist layer comprising non-crosslinked treated photoresist disposed on a first substrate surface;

casting a solution of an orientation control material in a first solvent on the treated patterned photoresist layer, and removing the first solvent, forming an orientation control layer;

heating the orientation control layer to effectively bind a portion of the orientation control material to a second substrate surface;

removing at least a portion of the treated photoresist and, optionally, any non-bound orientation control material in a second development process, thereby forming a pre-pattern for self-assembly;

optionally heating the pre-pattern;

casting a solution of a material capable of self-assembly dissolved in a second solvent on the pre-pattern and removing the second solvent; and allowing the casted material to self-assemble with optional heating and/or annealing, thereby forming the layered structure comprising the self-assembled material.

In another embodiment, a method of forming a layered structure comprising a self-assembled polymer is disclosed, the method comprising:

forming a photoresist layer comprising a non-crosslinking positive-tone photoresist capable of chemical amplification on a substrate; pattern-wise exposing the photoresist layer to first radiation; optionally heating the exposed photoresist layer; developing the exposed photoresist layer with an aqueous alkaline developer, thereby forming an initial patterned photoresist layer;

exposing the initial patterned photoresist layer with ultraviolet radiation at a dose of 1 to 200 $mJ/cm^2$; heating the exposed initial patterned photoresist layer at 80° C. to 250° C. for at least 1 sec, thereby forming a treated patterned photoresist layer comprising non-crosslinked treated photoresist disposed on a first substrate surface;

casting a solution of an orientation control material in a first solvent on the treated patterned photoresist layer and removing the first solvent, thereby forming an orientation control layer, wherein the orientation control material comprises repeating units derived from epoxydicyclopentadiene methacrylate or glycidyl methacrylate;

heating the orientation control layer to effectively graft a portion of the orientation control material to a second substrate surface;

removing at least a portion of the treated photoresist with the aqueous alkaline developer or another aqueous alkaline developer;

optionally, heating any remaining treated photoresist layer;

optionally, removing any non-grafted orientation control material with the first solvent or another solvent, thereby forming a pre-pattern for self-assembly;

optionally, heating the pre-pattern;

casting a solution comprising a polymer capable of self-assembly dissolved in a second solvent on the pre-pattern and removing the second solvent; and allowing the casted polymer to self-assemble while optionally heating and/or annealing the casted polymer, thereby forming the layered structure comprising the self-assembled polymer.

A method for creating oriented and aligned patterns from self-assembled polymers on a substrate surface that includes chemical patterns is disclosed, comprising:

forming a layer of a positive-tone photoresist on a substrate; pattern-wise exposing the photoresist; optionally baking the exposed photoresist; developing by selectively removing photoresist in the exposed regions; treating any remaining photoresist to reduce solubility of the treated photoresist in a first solvent suitable for dissolving a given orientation control material;

casting a solution of the given orientation control material dissolved in the first solvent on the treated photoresist and removing the first solvent, thereby forming a layer of orientation control material on a substrate surface;

grafting a layer of orientation control material to the substrate surface not covered by photoresist;

removing a portion of the treated photoresist, thereby forming pinning regions having a height less than a height of the treated photoresist;

optionally removing non-grafted orientation control material;

optionally baking the substrate;

applying a layer of self-assembling polymer over the orientation control material and the pinning regions, and allowing the self-assembling polymer to self-assemble; and optionally annealing the self-assembled polymers.

In another embodiment, a method of forming a layered structure comprising a self-assembled material, comprising:

forming a photoresist layer with a non-crosslinking photoresist on a substrate; pattern-wise exposing the photoresist layer to first radiation; optionally heating the exposed photoresist layer; and developing the exposed photoresist layer with an aqueous alkaline developer, thereby forming an initial patterned photoresist layer;

treating the initial patterned photoresist layer photochemically, thermally and/or chemically, thereby forming a treated patterned photoresist layer comprising non-crosslinked treated photoresist disposed on a first substrate surface;

casting a solution of an orientation control material in a first solvent on the treated patterned photoresist layer and removing the first solvent, thereby forming an orientation control layer disposed on the treated photoresist and a second substrate surface;

heating the orientation control layer to effectively bind a portion of the orientation control material to the second substrate surface and treated photoresist, forming a pre-pattern for self-assembly;

casting a solution of a material capable of self-assembly dissolved in a second solvent on the pre-pattern and removing the second solvent; and allowing the casted material to self-assemble while optionally heating and/or annealing the disposed material, thereby forming the layered structure comprising the self-assembled material.

In another embodiment, a method of forming a layered structure comprising a self-assembled polymer is disclosed, the method comprising:

forming a photoresist layer comprising a non-crosslinking positive-tone photoresist capable of chemical amplification on a substrate; pattern-wise exposing the photoresist layer to first radiation; optionally heating the exposed photoresist layer; developing the exposed photoresist layer in a first development process with a non-alkaline developer, thereby forming a negative-tone initial patterned photoresist layer;

treating the initial patterned photoresist layer photochemically, thermally and/or chemically, thereby forming a treated patterned photoresist layer comprising non-crosslinked treated photoresist disposed on a first substrate surface;

casting a solution of an orientation control material in a first solvent on the treated patterned photoresist layer, and removing the first solvent, thereby forming an orientation control layer;

heating the orientation control layer to effectively bind a portion of the orientation control material to a second substrate surface;

removing at least a portion of the treated photoresist and, optionally, any non-bound orientation control material in a second development process, forming a pre-pattern for self-assembly;

optionally heating the pre-pattern;

casting a solution of a material capable of self-assembly dissolved in a second solvent on the pre-pattern and removing the second solvent; and allowing the casted material to self-assemble with optional heating and/or annealing, thereby forming the layered structure comprising the self-assembled material.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

In the drawings, like elements are numbered alike.

FIG. 7B (bottom) is a SEM micrograph of the frequency-tripled patterns formed by the directed self-assembly of PS-b-PMMA on the sparse chemical pattern of Example 2 after oxygen plasma etching.

FIG. 12A is an SEM image pair of the treated photoresist after flood exposure and a 1 minute bake at 115° C. FIG. 12B is an SEM image pair of the treated photoresist after flood exposure, a 1 minute bake at 115° C., and a 2 minute bake at 185° C. FIG. 12C is an SEM image pair of the treated photoresist after flood exposure, a 1 minute bake at 115° C., a 2 minute bake at 185° C. and an additional 2 minute bake at 190° C.

FIG. 13A shows layered structure with the treated photoresist pattern. FIG. 13B shows the layered structure after the orientation control material has been coated onto the treated photoresist and baked. FIG. 13C shows the chemical pre-pattern after lift-off of the photoresist using standard TMAH developer.

DETAILED DESCRIPTION

Figure 1A:
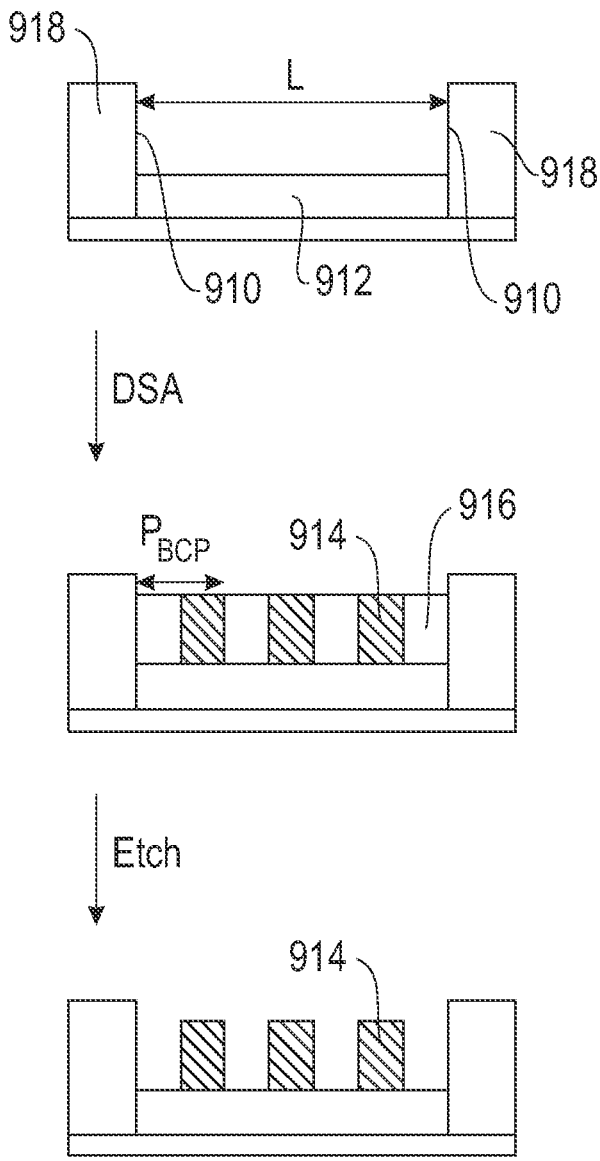
FIGS. 1A to 1C are schematic layer diagrams showing a method by which graphoepitaxy and chemical epitaxy (on dense and sparse chemical patterns) are typically implemented in the prior art.
Figure 1B:
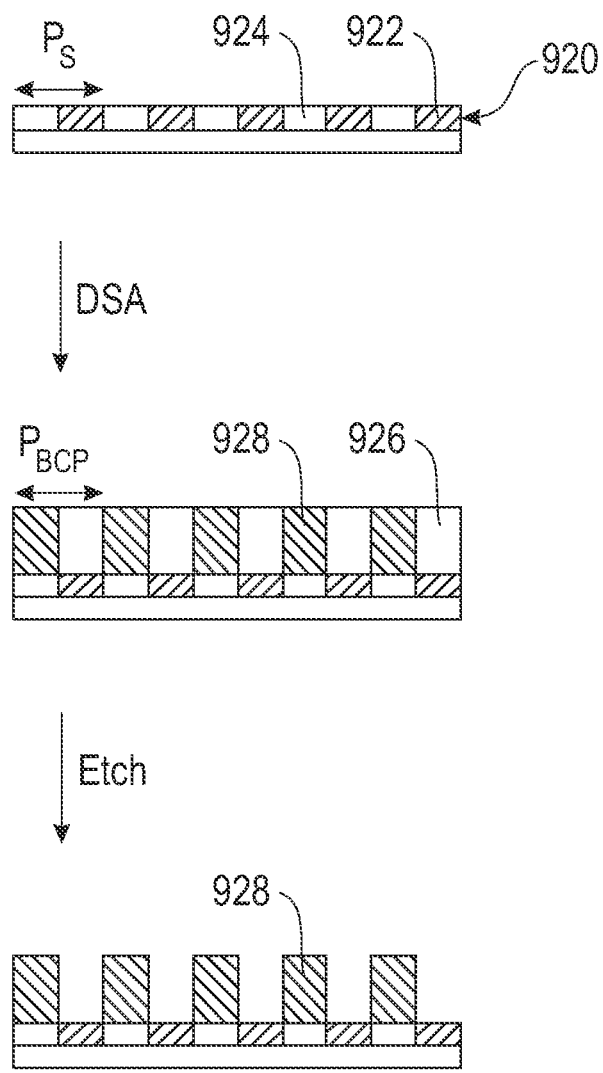

The methods described herein utilize a non-crosslinkable positive-tone photoresist to form a pre-pattern for DSA. The photoresist can be capable of chemical amplification. Using a conventional lithographic process, a photoresist layer disposed on a substrate is pattern-wise exposed and developed in a first development process, thereby forming an initial patterned photoresist layer (also referred to as the "initial layer"). The initial layer is then treated photochemically, thermally, and/or chemically, thereby forming a treated patterned photoresist layer (also referred to as the "treated layer"). The treated layer is insoluble in a casting solvent for an orientation control material. A solution of the orientation control material is then cast on the treated photoresist layer. The orientation control layer is not limited in thickness relative to the photoresist features. More specifically, the orientation control material can be substantially disposed in the trench of the photoresist features, and have a thickness less than or equal to a trench height of the photoresist feature. The layered structure is thermally treated to effect binding of the orientation control material to a substrate surface (e.g., an anti-reflection layer of a substrate). "Binding" includes covalent and/or non-covalent forms of adhering contact between the orientation control material and the substrate surface. Binding includes, for example, interlayer mixing (e.g., chain entanglement) at the layer boundary, electrostatic interactions, hydrogen bonding between the substrate surface and the orientation control material, and covalent bonding (e.g., grafting). In one embodiment, the treated photoresist and any non-bound orientation control material are removed by an appropriate second development process, thereby forming a layered structure having a chemically patterned surface useful for self-assembly. The chemically patterned surface comprises a first substrate surface comprising residual or no photoresist, and a second substrate surface comprising bound orientation control material. The first substrate surface can also serve as a pinning region. In another embodiment, a portion of the treated photoresist layer and any non-bound orientation control material are removed by an appropriate second development process, thereby forming a layered structure comprising photoresist features of reduced thickness. The surfaces of the photoresist features having reduced thickness, together with the surface comprising non-bound orientation control material can provide a chemical pre-pattern for self-assembly. The photoresist surface can also serve as a pinning region. In yet another embodiment, the treated photoresist and any non-bound orientation control material are not developed before applying a material for self-assembly. In this instance, the surfaces and topography of the treated photoresist and the orientation control material can together form a graphoepitaxial pre-pattern.

This "pattern-first, surface control-second" approach has several advantages over alternative methods known in the art. The initial photoresist patterning process is unchanged from a conventional lithographic process, and therefore can utilize the same photomasks, exposure tools, lithographic materials, stacked structures (including topcoats, photoresists, anti-reflective coatings, and underlayers, etc.), and processing conditions. Additionally, the photoresist pattern can be further manipulated prior to application of the orientation control material. For example, a trim process can be used to reduce a critical dimension (CD) of the photoresist features (leaving the overall pitch unchanged), and thereby overcome a resolution limitation of optical lithography tools. Finally, a large number of conventional positive-tone photoresist materials can be used in the disclosed method, with the proviso that they are capable of being rendered insoluble in a suitable casting solvent for an orientation control material.

A "pre-pattern" is a specific term used herein referring to the collection of surfaces contacted by the casting solution of the SA material. One or more of the surfaces directs self-assembly. The SA material, after removal of the casting solvent, can be disposed on all or some of these surfaces.

A "graphoepitaxial pre-pattern" is a pre-pattern in which topography and surface properties influence self-assembly. A "chemical pre-pattern" is a pre-pattern in which self-assembly is predominantly influenced by surface properties. No sharp dimensional limits exist between these two pre-pattern categories because the extent of topographical influence on self-assembly is also dependent on the thickness of the SA layer in relation to the underlying relief surface. In general, however, when graphoepitaxial pre-patterns are used, the thickness of the SA layer is less than or equal to the trench height of the underlying pre-pattern. For chemical pre-patterns, the SA thickness is greater than any trench height of the underlying topography.

As indicated above, a material capable of self-assembling into compositionally different, phase-separated domains is referred to as a SA material. The term "substrate" refers to all underlying layers of a structure on which the photoresist layer is disposed. The substrate can have one or more layers arranged in a stack. In a multi-layered substrate, the layer directly below and in contact with the photoresist layer is the top-most layer of the substrate, also referred to as "the underlayer" to the photoresist layer. The terms "surface" or "underlying surface" refer, unless otherwise stated, to the surface of the substrate on which the photoresist layer is disposed. As non-limiting examples, the photoresist layer can be disposed on the surface of a silicon wafer or a metal foil, or more particularly on the surface of an anti-reflection layer (ARC) of a multi-layer substrate, where the ARC layer is the top-most layer. In this example, the ARC layer is also the underlayer of the photoresist layer. In another example, the ARC layer has a polymer brush layer attached to the top surface. In this instance, the polymer brush layer is also the underlayer of the photoresist layer. The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness. The term "casting" refers to forming a layer of a material by disposing on another layer a solution of the material dissolved in a solvent, and removing the solvent. Unless otherwise stated, copolymers are random copolymers, indicated by "-co-", or "-r-" in the name. Block copolymers are indicated by "-b-" or "-block-" in the name. Alternating block copolymers are indicated by "-alt-" in the name.

The term "chemical amplification" is well known in the art of photoresists, and refers to the catalytic reaction of functional groups of the photoresist as catalyzed by a photogenerated species. The fundamentals of chemical amplification and its application to photoresist chemistry is reviewed by Ito in "Chemical Amplification Resists for Microlithography" *Adv. Polym. Sci.*, vol. 172, pp. 37-245 (2005). The most common chemically-amplified photoresists utilize photoacid generators (PAGs) and the most commonly employed reaction mechanism is the deprotection of protected polar functional groups. For example, acid-sensitive esters can be catalytically converted to more polar carboxylic acid groups by a photo-released acid. Chemical amplification typically occurs during a post-exposure bake, when one photo-generated acid molecule catalyzes the deprotection of many ester groups in the exposed areas. The chemically amplified photoresist has increased polarity compared to an as-exposed photoresist or the non-exposed photoresist.

Herein, a "positive-tone photoresist" is a photoresist that becomes more soluble in an aqueous alkaline developer when exposed to radiation. The positive-tone photoresist does not crosslink when it is exposed, developed, or when optionally baked before or after development. A "negative-tone photoresist" becomes less soluble in an aqueous alkaline developer when exposed, typically due to a photo-induced crosslinking mechanism.

"Negative-tone development" means the non-exposed areas of the photoresist layer are removed during development. "Positive-tone development" means the exposed areas of the photoresist layer are removed during development.

It is understood that in some cases (e.g., when forming dense, high resolution patterns) all of the photoresist layer can receive some dose of radiation exposure. By "non-exposed photoresist" is meant the portion of the photoresist layer that has received insufficient dose to switch the solubility of the photoresist, either before or after an optional bake, in a given developer compared to the pre-exposed photoresist. An "exposed photoresist" has received sufficient exposure to switch the solubility of the photoresist, either before or after an optional bake, in a given developer compared to the pre-exposed photoresist.

Casting a solution of orientation control material, or a solution of SA material, on a layer (e.g., the treated layer), is understood to mean that the solution makes contact with all the available surfaces of the layer (i.e., surfaces in contact with the surrounding atmosphere). These can include substrate surfaces, photoresist surfaces, and orientation control material surfaces. When referring to the chemical components, reactivity, solubility and/or surface properties of the initial layer or the treated layer, it is understood that such reference is directed only to the photoresist material and not to the substrate, the substrate surface, or an orientation control material surface, unless otherwise stated. Likewise, when referring to the chemical components, chemical reactivity, solubility and/or surface properties of the substrate surface or a substrate layer, such reference is directed only to the substrate surface or the substrate layer and not to the photoresist material or orientation control material unless otherwise stated. Further, when referring to the chemical components, chemical reactivity, solubility and/or surface properties of the orientation control material or orientation control layer, such reference is directed only to the orientation control material or orientation control layer and not to the photoresist material or substrate material, unless otherwise stated.

For clarity, it is also understood that the initial layer comprises "pre-treated photoresist" and the treated layer comprises "treated photoresist."

A "polarity change" herein implies an altered chemical composition that affects relative solubility without crosslinking. "Inducing a polarity change" in the initial layer means subjecting the photoresist to a treatment that alters the chemical composition so as to render the treated layer less soluble in a solvent compared to the initial layer. More specifically, the treated photoresist has "increased polarity" compared to the pre-treated photoresist. The treatment can include and an optional bake before and/or after the treatment, which can induce further increased polarity in the treated photoresist. The extent of the polarity change can be measured by comparing the solubility of the treated and pre-treated photoresist in a non-alkaline developer. The increased polarity renders substantially all of treated photoresist, not just the surface of the treated layer, insoluble in the casting solvent for the SA material, without crosslinking the photoresist.

Increased polarity can be achieved, for example, by deprotection of protected polar functional groups. Polar functional groups include carboxylic acid groups, phenols, higher aromatic alcohols, and alcohols. A number of processes exist for deprotecting protected polar functional groups in the initial layer. For example, a second exposure (e.g., a whole area exposure, also termed flood exposure) of the initial layer with second radiation can generate a strong acid from photoacid generator (PAG). During a subsequent post-exposure bake, the photo-released acid can then, for example, catalyze the deprotection of acid-sensitive tertiary carboxylic ester groups in the initial layer. Another method of deprotection involves direct thermolysis of protecting groups at elevated temperature. Alternatively, thermolysis of a thermal acid generator or a photoacid generator can create strong acid molecules that can catalyze the acidolysis of protecting groups. A large number of suitable acid-labile or temperature-labile protecting groups for polar functional groups such as carboxylic acids and phenols are described in Wuts, P. G. M. and Greene, T. W. *Greene's Protective Groups in Organic Synthesis*, 4$^{th}$ ed. John Wiley & Sons; Hoboken, N.J., 2007; and Kocienski, P. J. *Protecting Groups*, 3$^{rd}$ ed. Georg Thieme Verlag: Stuttgart, Germany, 2005. In particular, the protecting groups include tertiary esters, orthoesters, acetals, ketals, carbonates, silyl ethers and silyl esters.

The extent of deprotection required to induce a change in the solubility of the treated photoresist in the casting solvents used for the orientation control material and the SA material will depend upon the photoresist composition and the casting solvent, among other factors. Notably, the extent of deprotection need not be 100%. In a positive-tone photoresist that is capable of chemical amplification, the solubility of the exposed and baked photoresist in an aqueous alkaline developer is typically non-linear with respect to the percent deprotection, and can change by orders of magnitude over a relatively small percentage change in deprotection. In fact, it is this non-linear response that rectifies the often diffuse sinusoidal aerial image of the exposed photoresist into the desired sharp square pattern profiles in the developed initial layer. In the present method, this phenomenon is advantageously used to render the treated photoresist insoluble in a selected casting solvent for the orientation control material and the SA material. Only a small or moderate extent of deprotection may be required to render the treated photoresist insoluble in a desired solvent. Complete deprotection can, in some cases, be undesirable due to unacceptable pattern distortion induced by the loss of such large quantities of protecting groups.

Advantageously, the glass transition temperature ($T_g$) of the treated photoresist is higher than the $T_g$ of the pre-treated photoresist. A higher glass transition temperature prevents photoresist reflow under additional thermal treatment, which can deform topographical features as demonstrated in example 7. Consequently, the deprotection of protected polar groups in the initial layer simplifies the DSA process and provides a wider process window for additional thermal treatment. As an additional benefit, the method provides a simpler route to rework or selectively remove the treated photoresist. For example, the treated photoresist containing deprotected polar groups may be dissolved in an alkaline developer or a significantly more polar solvent for rework. Alternatively, the treated photoresist may be selectively removed from at least one domain of the SA material if there is a sufficiently large polarity difference between the treated photoresist and the SA domain.

Figure 3A:
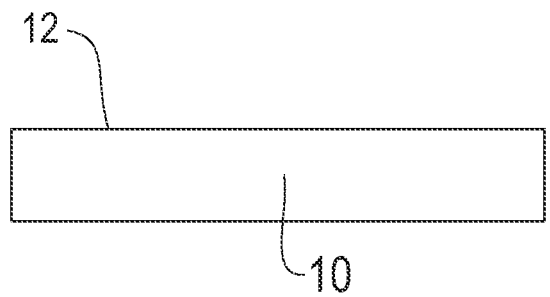
FIGS. 3A to 3L are schematic layer diagrams showing a disclosed method of generating a sparse chemical pre-pattern using a lift-off approach; that is, using a second development process to remove photoresist and non-bound orientation control material before casting a solution of SA material. After patterning a positive-tone photoresist on a substrate, the resulting photoresist pattern is treated to render it insoluble in a casting solvent for an orientation control material. An orientation control material is disposed on the treated photoresist pattern. The orientation control layer is then treated to bind the orientation control material to the substrate. The treated photoresist and any non-bound orientation control material are then removed to generate a chemical pattern. The pre-pattern comprises pinning regions of the substrate surface containing residual or no photoresist surrounded by other regions of the substrate surface containing bound orientation control material. Self-assembly of a SA material is then effectively directed by the chemical pattern.
Figure 3B:
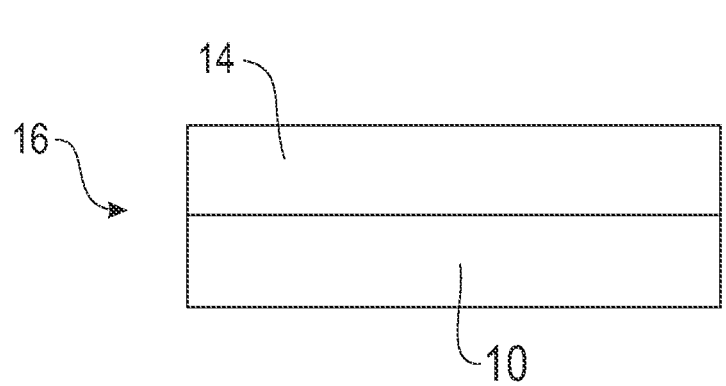
Figure 3C:
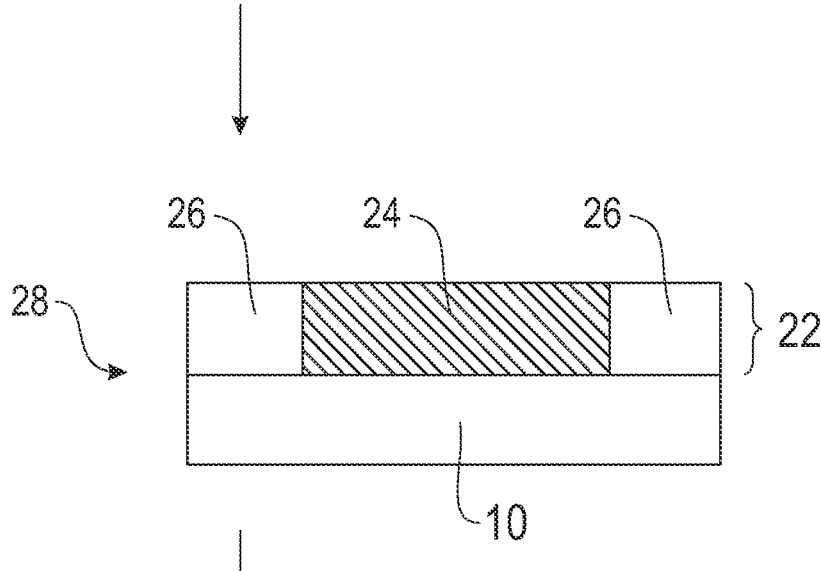
Figure 3D:
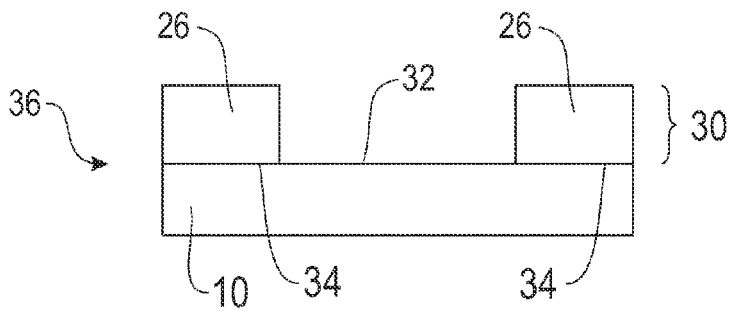

One embodiment of the disclosed method, in which a second development process is used to remove the treated photoresist and non-bound orientation material, is illustrated in the schematic layer diagrams of FIGS. 3A to 3L. Substrate 10 of FIG. 3A has surface 12, on which is disposed positive-tone photoresist layer 14 (FIG. 3B, structure 16). Pattern-wise exposure of photoresist layer 14 with radiation using a mask (not shown) produces exposed photoresist layer 22 (FIG. 3C, layered structure 28). Exposed photoresist layer 22 can optionally be given a post-exposure bake (not shown). Exposed photoresist layer 22 is composed of regions of exposed photoresist 24 and non-exposed photoresist 26. Positive-tone development using an aqueous alkaline developer, particularly tetramethylammonium hydroxide (TMAH), removes exposed photoresist 24, producing initial layer 30 (i.e., initial patterned photoresist layer) comprising non-exposed photoresist 26 disposed on a first substrate surface 34 (FIG. 3D, structure 36). Second substrate surface 32 of substrate 10 is uncovered by development and has substantially no photoresist thereon. Initial layer 30 can be optionally rinsed or baked to reduce defects or remove residual solvent.

Optionally, the geometry of the initial layer 30 topographical features can be adjusted by a secondary process prior to treating the initial layer. In an embodiment, a dimension of the initial layer is decreased before treating the initial layer. For example, a second lithographic process can be used to cut or trim a dimension of the initial photoresist lines. Alternatively, the critical dimensions of the photoresist lines can be decreased using reactive ion etching. Another suitable trim process comprises casting a layer of an immersion topcoat material (such as JSR TCX-041, a material having strongly acidic groups that can deprotect the outer portion of the photoresist) on top of the photoresist pattern, baking the wafer, and removing the topcoat and a portion of photoresist material using TMAH developer.

Figure 3E:
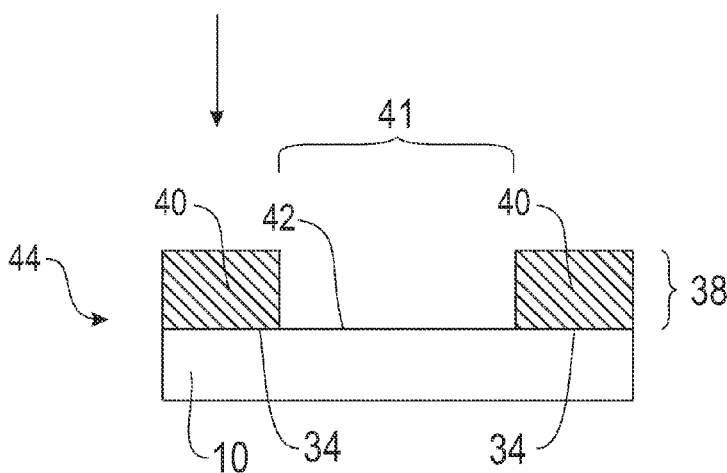

Initial layer 30 is treated photochemically, thermally, chemically, or a combination thereof, to render non-exposed photoresist 26 insoluble in a first solvent used to cast an orientation control material and/or a second solvent used to cast a SA material, forming treated layer 38 (i.e., "treated patterned photoresist layer", FIG. 3E, structure 44). Treated layer 38 comprises treated photoresist 40 disposed on first substrate surface 34. Treated photoresist 40 is more polar and has less solubility in the first and/or second solvent compared to non-exposed photoresist 26 of FIG. 3D. Also shown is second substrate surface 42 of substrate 10, having a composition capable of binding an orientation control material.

The term "treating" with reference to the photoresist refers to methods of rendering the photoresist insoluble in a solvent or a developer without crosslinking the photoresist. The treated layer remains structurally stable when contacted by the casting solution of the orientation control material or the casting solution of the SA material. However, the treatment does not render the treated photoresist 40 insoluble in all known solvents and/or developers. For example, the treatment does not irreversibly crosslink the treated photoresist such that the treated photoresist cannot be removed by any process short of ashing or aggressive chemical stripping (e.g, using a mixture of sulfuric acid and hydrogen peroxide (so-called piranha etch)). In an embodiment, the treated photoresist is not soluble in a low polarity casting solvent (e.g., anisole) suitable for casting the orientation control material. In another embodiment, the treated photoresist is not soluble in a moderately polar casting solvent for the orientation control material, such as a monoalcohol glycol, glycol monoether, or glycol mono ether ester. In an embodiment, the treatment induces a polarity change throughout the thickness of the treated photoresist features, not merely a portion thereof.

As stated, the treatment can be photochemical, thermal, chemical, or a combination of thereof. In general, the treated photoresist has increased polarity arising from an increased concentration of polar functional groups formed in the photoresist by the treatment. The increased polarity can vary depending on the photoresist material and the treatment conditions. Increased polarity can be achieved, for example, by deprotection of protected polar functional groups. Polar functional groups include carboxylic acid groups, phenols, higher aromatic alcohols, and alcohols. There are a number of processes by which deprotection of protected polar functional groups in the initial layer can be accomplished. In one example, the initial layer is treated photochemically by flood exposing the initial layer with second radiation, generating a strong acid from a photoacid generator (PAG) in the photoresist material. The second radiation can comprise the first radiation used to pattern-wise expose the photoresist layer. Optionally, the flood exposure is followed by a bake to form the treated layer. The flood exposure can be performed with a single wavelength of radiation or a combination of suitable wavelengths (broad band) of radiation, so long as the exposure is effective in inducing the desired polarity change in the treated photoresist. The flood exposure can be from 1 to 200 mJ/cm$^2$, more particularly from 2 to 150 mJ/cm$^2$, or even more particularly from 3 to 100 mJ/cm$^2$. The flood exposure can be a single conventional whole area exposure or a combination of conventional whole area exposures. The photochemical treatment can also be a scanning exposure delivered by digital exposing device such as a laser, light-emitting diode (LED), cathode ray tube (CRT), or spatial light modulator (e.g., DLP chip). E-beam and extreme ultraviolet exposing devices can be also be employed for the photochemical treatment. During a subsequent post-exposure bake, the photo-released acid can catalyze the deprotection of acid-sensitive tertiary carboxylic acid esters and aromatic ethers/acetals and carbonates, chemically amplifying the concentration of carboxylic acid and phenol groups in the treated photoresist. With sufficient polarity change, the treated photoresist can be rendered insoluble in a less polar solvent (e.g., anisole) used to dissolve and cast the orientation control material or the SA material. Alternative methods to accomplish deprotection involve thermolysis of protecting groups at elevated temperature. Thermolysis of a thermal acid generator or a photoacid generator can create strong acid molecules that can catalyze the acidolysis of the protecting groups. A large number of suitable acid-labile or temperature-labile protecting groups for polar functional groups such as carboxylic acids and phenols are described in Wuts, P. G. M. and Greene, T. W. *Greene's Protective Groups in Organic Synthesis*, 4$^{th}$ ed. John Wiley & Sons; Hoboken, N.J., 2007; and Kocienski, P. J. *Protecting Groups*, 3$^{rd}$ ed. Georg Thieme Verlag: Stuttgart, Germany, 2005. In particular, the protecting groups can include tertiary esters, orthoesters, acetals, ketals, carbonates, silyl ethers and silyl esters. An additional thermal annealing bake may be used to tune the solubility of the treated layer. For example, with additional thermal treatment the treated photoresist can be rendered insoluble in moderately polar solvents such as a glycol mono ether ester (e.g., PGMEA). The thermal treatment can comprise heating the initial layer or the photochemically treated initial layer at a temperature of, for example, from 60° C. to 300° C., from 80° C. to 250° C., from 80° C. to 220° C., from 100° C. to 210° C., or from 150° C. to 210° C. Heating at each of the foregoing temperature ranges can be performed, for example, for a period of at least 1 sec, 1 sec to 1 day, 1 sec to 12 hours, 1 sec to 1 hour, 10 sec to 30 minutes, 10 sec to 15 minutes, 30 sec to 15 minutes, 30 sec to 10 minutes, 30 sec to 8 minutes, 30 sec minutes to 6 minutes, or 1 minute to 5 minutes. More particularly, the initial layer or the photochemically treated initial layer can be heated at a temperature of, for example, from 60° C. to 300° C. for 1 sec to 1 hour, from 80° C. to 250° C. for 10 sec to 15 minutes, from 150° C. to 230° C. for 30 sec to 10 minutes, or from 150° C. to 210° C. for 30 sec to 6 minutes. Even more particularly, the initial layer or the photochemically treated initial layer can be heated at 150° C. to 210° C. for 1 minute to 5 minutes. The thermal treatment can comprise one or more thermal treatments independently selected from temperatures of from 60° C. to 300° C. and heating times of at least 1 sec. For example, a first thermal treatment at a lower temperature can be followed by a second thermal treatment at a higher temperature. In some instances, this may advantageously prevent pattern collapse or pattern distortion caused by immediately applying a thermal treatment at a temperature far above the glass transition temperature of the patterned photoresist material.

Alternatively, a negative-tone development process can be used to form an initial patterned photoresist layer. Negative-tone development using a non-alkaline developer (e.g., a low polarity organic solvent) selectively removes the non-exposed photoresist 26 leaving behind exposed photoresist 24 (not shown), which is now the "pre-treated photoresist." The exposed photoresist 24 is insoluble in a low polarity casting solvent for the orientation control material. The orientation control material can be applied directly to the exposed photoresist 24 without further treatment, or after additional optional treatment to further decrease the solubility of the exposed photoresist in suitable casting solvents for the orientation control material and/or the SA material. As before, the treatment can be photochemical, thermal, and/or chemical. In an embodiment, the exposed photoresist is treated by baking or thermally annealing the exposed photoresist, thereby forming the treated patterned photoresist layer. When using a negative-tone development method, one must take into account the tone reversal when designing the initial mask layout. In addition, negative-tone development processes are not well established in the industry for positive-tone photoresists.

Also contemplated are water-developable or alkali-developable negative-tone resists that operate by a polarity change mechanism rather than by a crosslinking mechanism, provided the resulting pattern is or can be treated to become insoluble in a casting solvent for the orientation control material or the SA material. However, few, if any commercial high resolution negative-tone photoresists operate by this mechanism. Therefore, the present method preferentially utilizes high resolution, positive-tone photoresists to make the initial patterned photoresist layer, either by positive-tone or negative-tone development.

Figure 3F:
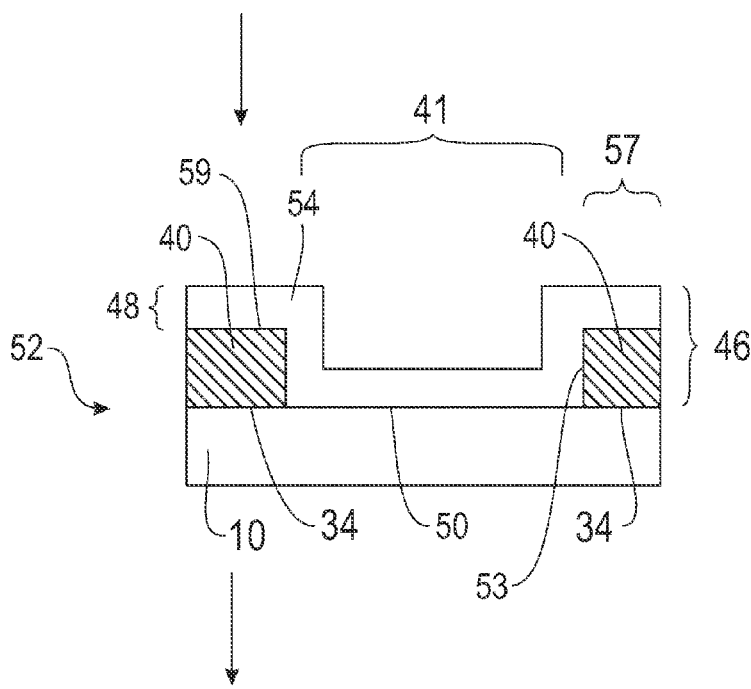

A solution of the orientation control material dissolved in a first solvent is then cast on the treated layer 38, which is not soluble in the first solvent. Removal of the first solvent provides layer 46 (FIG. 3F, structure 52) comprising photoresist features 57 comprising treated photoresist 40 disposed on first substrate surface 34, and orientation control layer 48 comprising orientation control material 54. As shown in FIG. 3F, orientation control layer 48 can be disposed on photoresist surface 59, sidewall 53, and second substrate surface 50. Alternatively, orientation control material 54 can be wholly or substantially located in the trench 41.

The orientation control layer 48 is then thermally treated to bind a portion of the orientation control material 54 to the second substrate surface 50. The bound orientation control material 58 is not soluble in a solvent utilized in a second development process described further below. The thermal treatment can induce crosslinking in the orientation control material. The thermal treatment can comprise heating the orientation control layer at a temperature, for example, of from 60° C. to 300° C., from 80° C. to 250° C., from 80° C. to 240° C., from 100° C. to 230° C., from 150° C. to 220° C., or from 165° C. to 220° C. The orientation control layer can be heated at each of the foregoing temperatures for a period of time of, for example, at least 1 sec, from 1 sec to 1 day, from 1 sec to 12 hours, from 1 sec to 1 hour, from 10 sec to 30 minutes, from 10 sec to 15 minutes, from 10 sec to 15 minutes, from 10 sec to 10 minutes, from 10 sec to 5 minutes, from 10 sec to 2 minutes, from 10 sec to 1 minute, or from 10 sec to 30 sec. The thermal treatment can comprise a single bake step or two sequential bake steps at different temperatures.

Figure 3G:
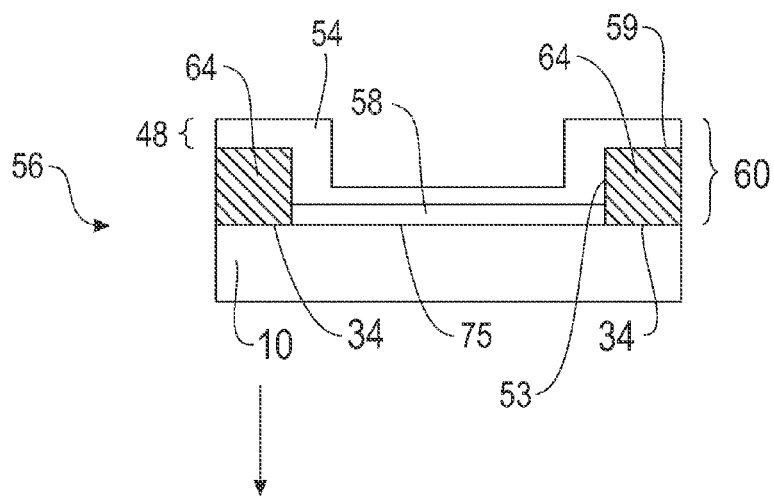
Figure 3H:
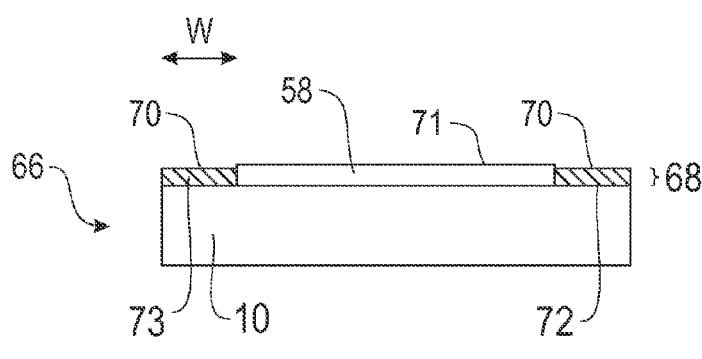

The result is structure 56 (FIG. 3G) comprising layer 60 comprising bound orientation control material 58 and non-bound orientation control material 54. The interface between bound orientation control material 58 and non-bound orientation control material 54 can be a sharp boundary as depicted in FIG. 3G, or a more graduated boundary. The interface between bound orientation control material 58 and substrate surface 50 can also be a sharp boundary as depicted in FIG. 3G, or a more graduated boundary caused by intermixing of the materials at the interface. In an embodiment, there is little or no non-bound orientation control material; that is, the bound orientation control material 58 can be as thick as layer 48. Bound orientation control material 58 can have a thickness of, for example, from 0.1 to 100 nm, more particularly from 0.5 to 50 nm, and even more particularly from 2 to 30 nm. Treated photoresist 64 is also indicated, which can have increased polarity compared to treated photoresist 40 after treating the orientation control layer 48.

Binding of the orientation control material 54 to surface 50 can be achieved through covalent bonding (e.g., grafting), intermixing (e.g., chain entangling) of the two layers, ionic bonding as in a mordant, or by another interaction of the materials of the two layers that renders the bound orientation control material 58 insoluble or less soluble in a second development process compared to the non-bound orientation control material 54.

Increased binding contact of the orientation control material 54 to the treated photoresist 64 can also occur. The orientation control material can be bound to the sidewalls 53 and/or top surface 59 of the photoresist features 57 during the application and treatment of the orientation control material.

In one embodiment heating the orientation control layer causes the orientation control material to be grafted to the underlying substrate surface 50. An acidic catalyst can be utilized to accelerate the grafting reaction. The acidic catalyst can take the form of a free acidic species, a photoacid generator, or thermal acid generator. An additional baking step can also be used to accelerate or complete the grafting process.

Structure 56 can be submitted to a second development process to remove the treated photoresist 64 and any non-bound orientation control material 54. The second development process can include one or more development steps. The development steps can be performed under different process conditions such as temperature or pH, and can utilize the same solvent or different solvents. In an embodiment, the second development process comprises dissolving at least a portion of the treated photoresist with aqueous alkaline developer, and optionally, dissolving the non-bound orientation control material in the first solvent used to cast the orientation control material, the second solvent used to cast the SA material, or another solvent. The second development process steps can be performed in reverse order if desired. For example, the non-bound, including any non-grafted orientation control material, can be removed prior to removing at least a portion of the treated photoresist. In a further embodiment, the second development process comprises dissolving substantially all of the treated photoresist. In another embodiment, the second development process comprises dissolving the treated photoresist and the non-bound orientation control material simultaneously with a single solvent. The resulting structure 66 (FIG. 3H) comprises a chemically patterned surface 68 comprising first surface 70 of residual photoresist 73. Chemically patterned surface 68 also comprises second surface 71 comprising bound orientation control material 58. Any topological differences between first surface 70 and second surface 71 have negligible, if any influence, on subsequent self-assembly. First surface 70 and second surface 71 together form a chemical pre-pattern for self-assembly.

In this embodiment, the orientation control material should be selected such that, after grafting, it does not prevent the second development process from removing at least a portion of the treated photoresist. For example, orientation control materials which employ crosslinkable groups (e.g., glycidyl or epoxydicyclopentadienyl groups) should be selected such that they do not form a layer (or shell) of orientation control material covering the surfaces of the treated photoresist which are extensively crosslinked and could, thereby, prevent the development of the treated photoresist. Some methods by which this potential problem can be prevented include limiting the thickness of the orientation control material, limiting the amount of crosslinkable groups in the orientation control material, and reducing the molecular weight of the polymers comprising the orientation control material.

In the case of a typical 193 nm positive-tone photoresist, the treated photoresist material can comprise a methacrylic acid-rich polymer that can be removed using a TMAH developer. Alternatively, the second developer can comprise a polar solvent such as PGMEA, ethyl lactate, gamma-butyrolactone, and propylene carbonate developer. Depending upon the degree of treatment, the photoresist can be completely removed to reveal the substrate surface 72 (FIG. 3H), in which case the chemical pre-pattern would comprise first substrate surface 72 and second surface 71, wherein substrate surface 72 can be the pinning region (e.g., an ARC surface). Typically, some residual photoresist 73 remains as shown and the thin layer of highly polar, residual photoresist can serve as a hydrophilic pinning region. The amount of the residual photoresist 73 can be tuned by manipulation of the photoresist treatment conditions, the choice of the second developer solvent, and the length of the second development process. The chemical pre-pattern can be further tuned by thermally annealing or chemically altering the material in the pinning regions (e.g., the first surface 70 of residual photoresist 73). Chemical alteration can be accomplished by selectively reacting the first surface 70 with a chemical agent or by adjusting the pH (e.g., controlling the extent of ionization of carboxylic acid groups).

The residual photoresist 73 is thin enough that its topography does not hinder self-assembly of the SA material or subsequent pattern transfer to the substrate. The residual photoresist can have a thickness of, for example, from 0 to 500 angstroms, more particularly from 1 to 250 angstroms, from 15 to 150 angstroms, or even more particularly from 30 to 100 angstroms. Further, the bound orientation control material 58 after the second development can have a thickness of, for example, from 1 to 500 angstroms, more particularly 15 to 300 angstroms, and even more particularly 15 to 200 angstroms. Lithographic patterning of such small amounts of a photoresist on a controlled surface is not ordinarily effective in creating a chemical pre-patterns for DSA. Such very thin layers are extremely difficult to form and pattern directly with the required precision and uniformity. The disclosed method overcomes this problem by generating a chemically patterned surface comprising residual photoresist that can be utilized for the pinning region during self-assembly. Non-pinning region (second surface 71 comprising bound orientation control material) can support, for example, the perpendicular orientation of self-assembled domains.

Figure 4A:
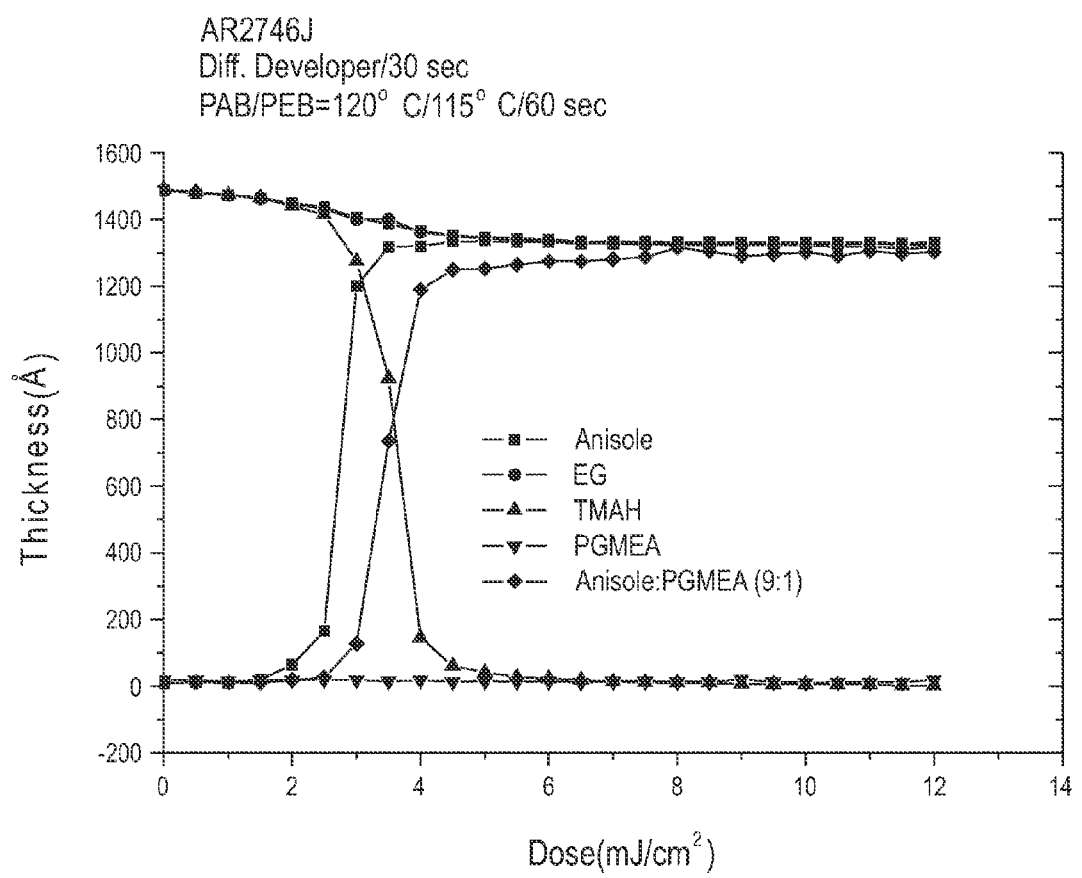
FIGS. 4A and 4B are graphs depicting development contrast curves obtained with different solvent developers for two photoresists: JSR AR2746J (FIG. 4A), JSR AR2928JN (FIG. 4B). The lighter filled square symbols correspond to the latent thickness after exposure and bake but prior to development. The dark filled symbols correspond to the residual thickness after development.
Figure 4B:
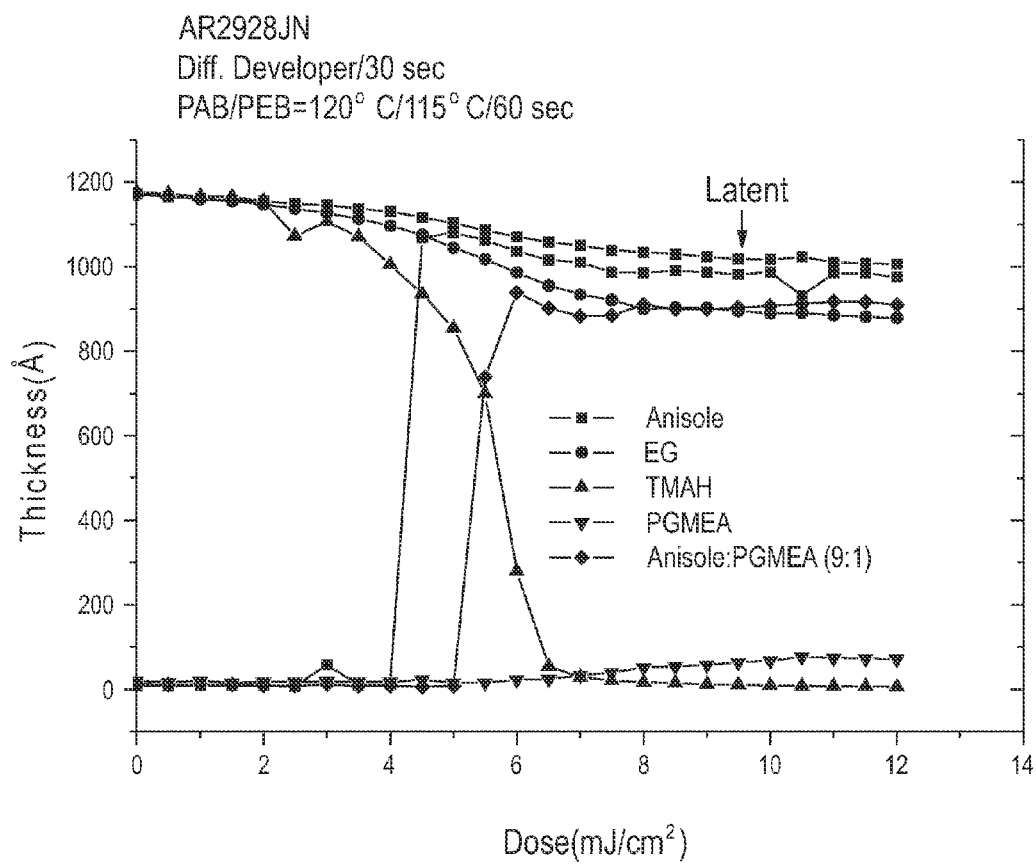

The amount of residual treated photoresist 73 (FIG. 3H) left behind after the second development is dependent upon the photoresist, the developing solvent, and the processing conditions. This is demonstrated in the graphs of FIGS. 4A and 4B (see also Example 1 described further below), which show development contrast curves (thickness versus exposure in mJ/cm$^2$) obtained using different developer solvents with two typical commercial 193 nm positive-tone photoresists capable of chemical amplification: JSR AR2746J (FIG. 4A), and JSR AR2928JN (FIG. 4B). In FIG. 4A, typical positive-tone development is accomplished using 0.26N TMAH developer, to remove exposed photoresist. While moderately polar solvents, such as PGMEA, dissolve the positive photoresist regardless of the exposure dose, lower polarity solvents like anisole and anisole/PGMEA (9:1) only dissolve the photoresist that has experienced little increase in polarity due to a low exposure dose. The photoresist material that has been exposed to higher radiation doses and/or has undergone further polarity increase during baking is even less soluble in a low polarity solvent (e.g., anisole). This behavior can be utilized to control photoresist solubility without cross-linking the photoresist. By flood exposing and baking the patterned photoresist, a sufficient polarity increase ensures the treated photoresist will not be soluble in a casting solvent, such as anisole, for the orientation control material. The behavior of JSR AR2928JN is slightly different, as shown in FIG. 4B. In this case, when PGMEA is used as a developer, a thin layer of residual photoresist is left on the surface at higher exposure doses. As described above, photoresists that display this behavior can be used to form a thin layer of residual photoresist if such a solvent is used for the second development. The thermal history of the photoresist layer, the polarity of the developing solvent, the development conditions, development time, and other parameters can be used to tune the thickness residual photoresist layer.

Figure 3I:
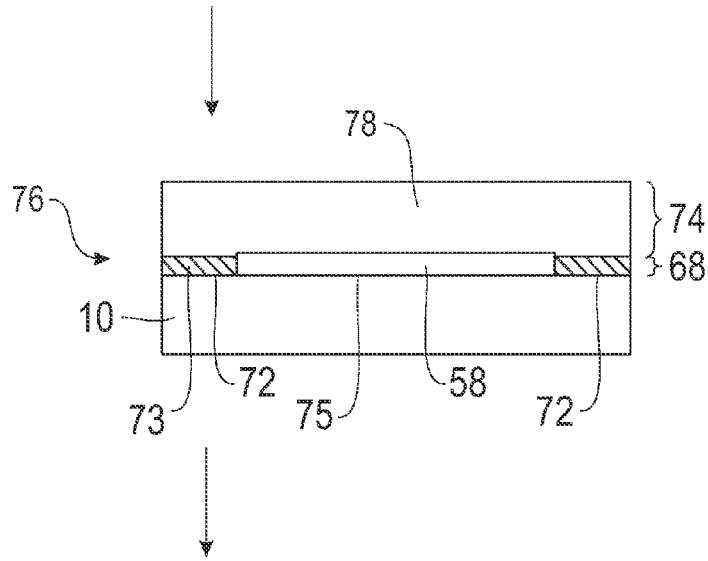
Figure 3J:
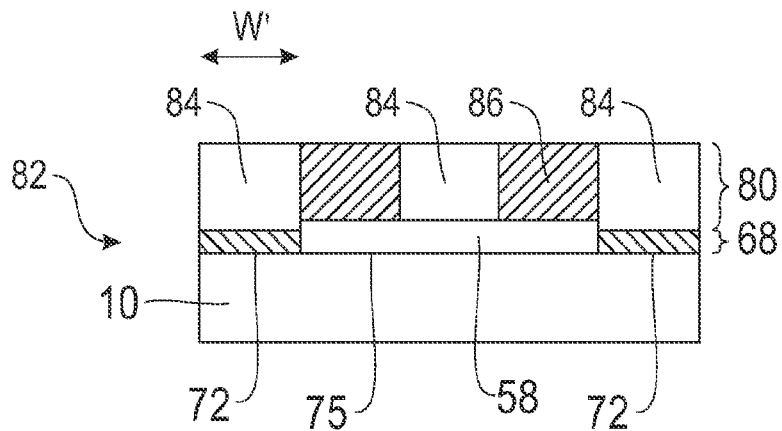

A solution is prepared comprising one or more SA materials dissolved in a second solvent. The solution is cast onto chemically patterned surface 68, followed by removal of the second solvent, thereby forming SA layer 74 (FIG. 3I, structure 76). The solution of SA material can additionally comprise other materials including polymers, block copolymers, surfactants, photoacid generators, and thermal acid generators. For example, an organosilicate resin can be included that is miscible with the poly(ethylene oxide) domains of poly (ethylene oxide-block-styrene) copolymer. SA material 78 is allowed to phase separate and the resulting domains align as directed by the underlying chemical pre-pattern to form a domain pattern 80 of self-assembled material (FIG. 3J, structure 82). Phase separation and alignment can occur during film formation, during a post-application bake, or during a subsequent annealing process. Suitable annealing processes include thermal annealing, thermal gradient annealing, solvent vapor annealing or annealing by other gradient fields. Domain pattern 80 comprises a first domain 84 and second domain 86 of SA material 78. First and second domains 84 and 86 comprise different components of SA material 78; that is, they are compositionally different. First domain 84 can, for example, comprise one block of a block copolymer, and second domain 86 can comprise a different block of a block copolymer.

Figure 1C:
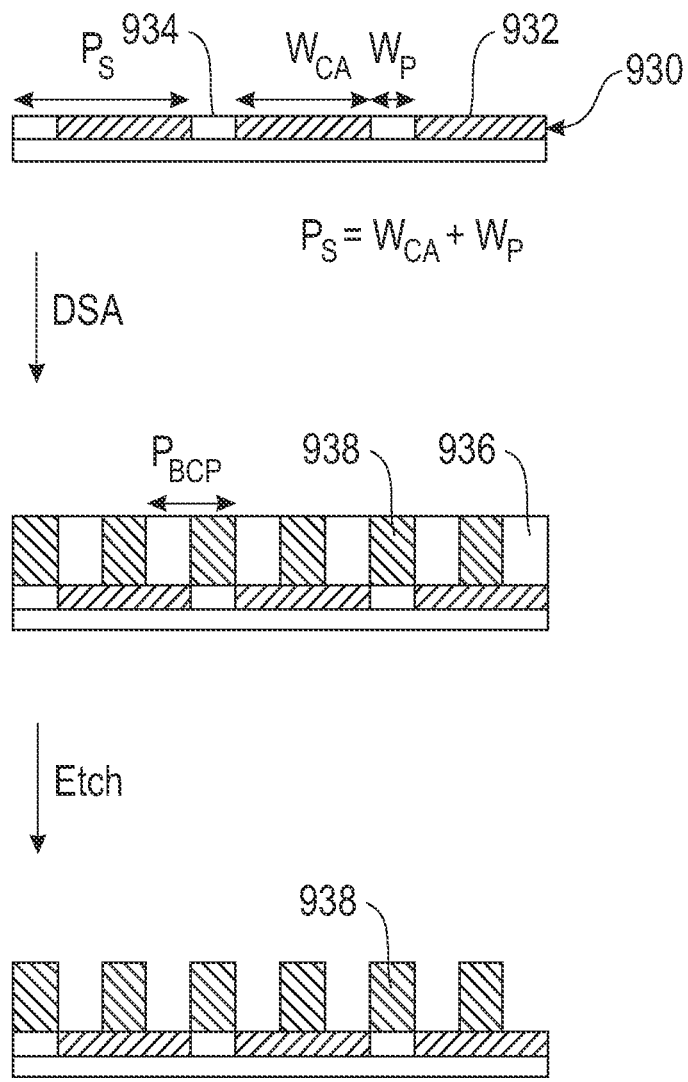
Figure 2A:
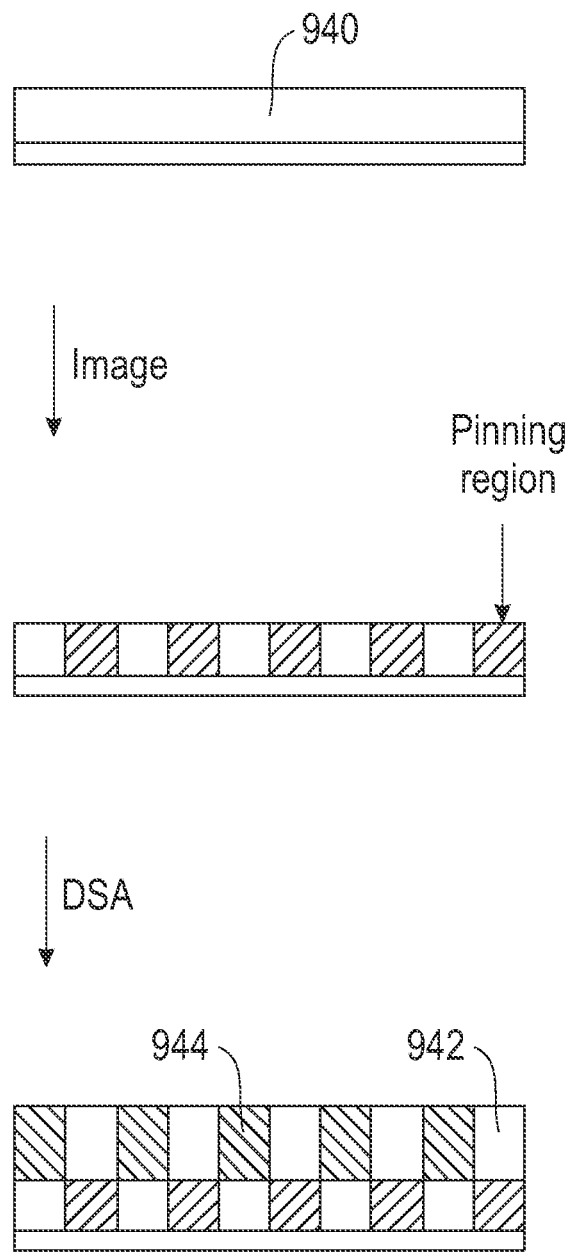
FIGS. 2A to 2D are schematic layer diagrams showing a method by which dense and sparse chemical patterns have been prepared and utilized in the prior art.
Figure 2B:
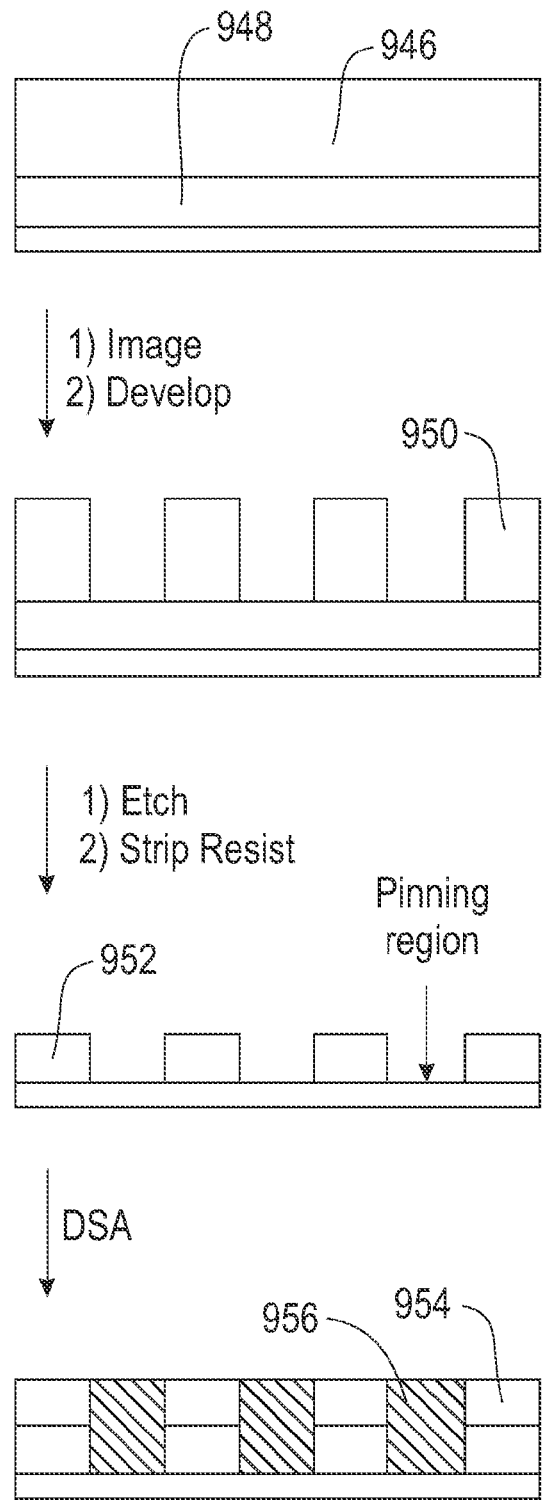
Figure 2C:
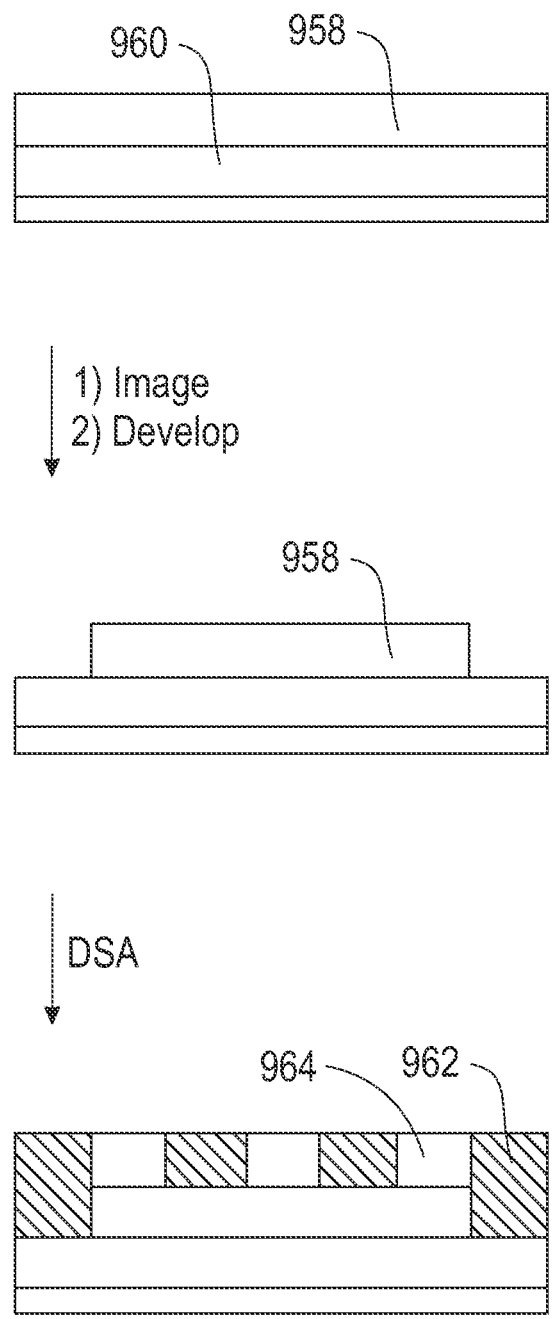
Figure 2D:
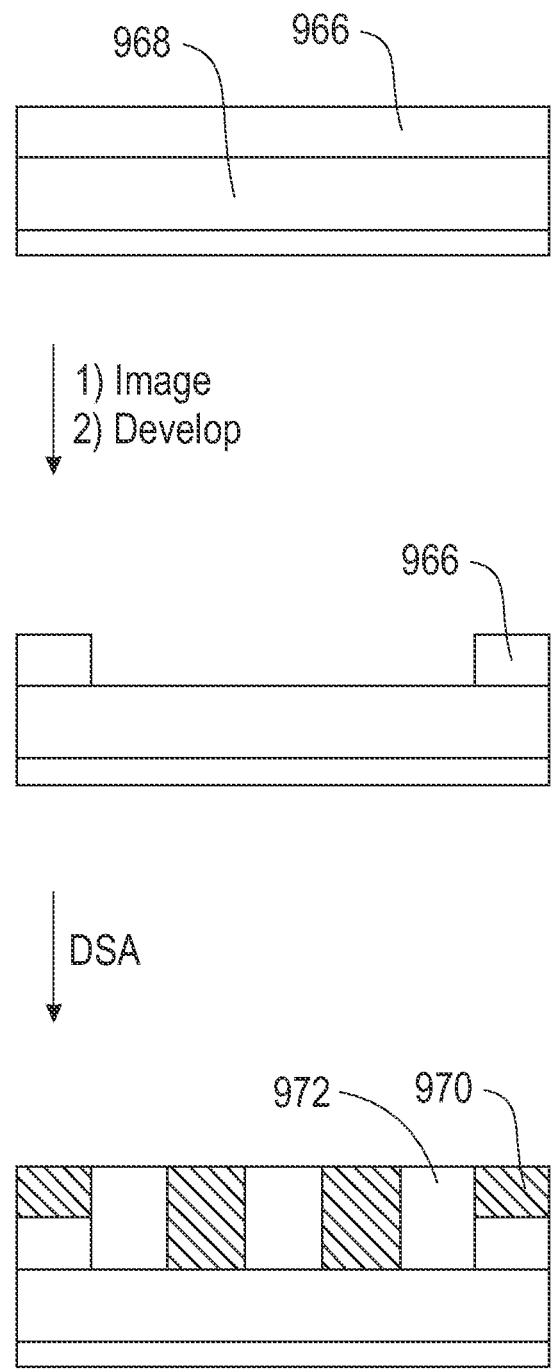

The SA material self-organizes to form domains on the chemically patterned substrate in order to minimize the interfacial energy between SA material and the pre-patterned substrate (i.e., the chemical pre-pattern). With sparse chemical patterns, SA domain patterns can achieve a frequency multiplication of $P_S/P_{BCP}$, where $P_S$ is the periodicity of the chemically patterned surface (see FIG. 1C) and $P_{BCP}$ is the periodicity of the SA material (e.g., block copolymer (BCP)). For example, a chemical pattern with $P_S=2P_{BCP}$ and $W_P=0.5P_{BCP}$, where $W_P$ is the width of the pinning region, can be used to direct block copolymer (BCP) self-assembly to form domains that effectively double the line-space frequency of the chemical pre-pattern. Higher frequency multiplication can be achieved by using chemically patterned substrates with larger $P_S/P_{BCP}$ ratios. Most advantageously, the method can utilize commercially available optical lithography tools, processes, and materials to generate the chemical pattern without any additional etch processes. In addition, the ability to trim the photoresist pattern prior to application of the orientation control material allows the size of the pinning regions to be less than the resolution of the optical lithography tool.

The width (w) of the first substrate surface 70 (FIG. 3H) can be larger than the width (w') of the first domain 84 for which it has preferential affinity due to resolution limits of the lithographic tool. Therefore, more than a single domain can self-assemble on the first surface 70; however, the pitch of the chemical pre-pattern should be roughly commensurate with an integral multiple of the pitch of the self-assembled domains. In a preferred embodiment, the width (w) of the first substrate surface 70 is approximately equivalent to the width (w') of the domain 84 for which it has preferential affinity.

The width of the second surface 71 (FIG. 3H) can be equivalent to the width of the second domain 86. In such an embodiment, the pitch of the chemical pre-pattern 68 will be equivalent to the pitch of the self-assembled domains. However, given the resolution limitations of optical lithography tools, the width of the second surface 71 can be significantly larger than the width of the second domain 86. Therefore, more than a single domain can self-assemble on the second surface 71; however, the pitch of the chemical pre-pattern should be roughly commensurate with an integral multiple of the pitch of the self-assembled domains. For example, multiple domains 84 and 86 can self-assemble on top of the second surface 71 comprising bound orientation control material 58 (FIG. 3J).

Figure 3K:
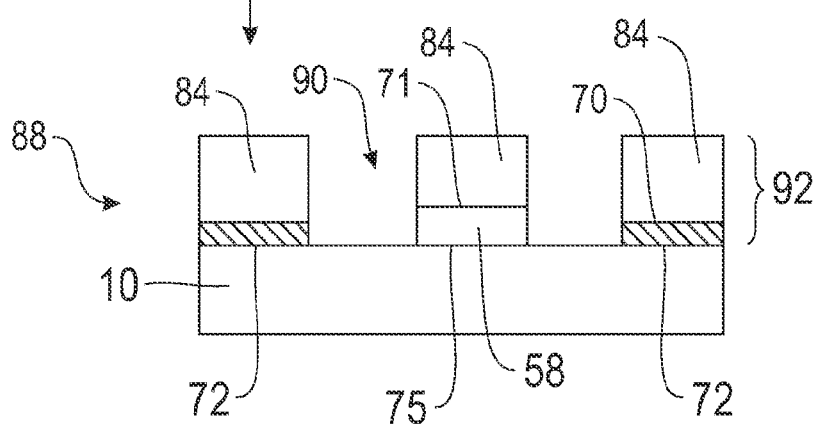

Further, one of the domains, for example second domain 86, can be selectively removed (e.g., ion-etched) or modified in the presence of the first domain 84, to generate topographical or chemical contrast, exemplified by structure 88 (FIG. 3K). As shown in FIG. 3K, selective removal of second domain 86 also removes underlying orientation control material producing a relief pattern 92 comprising first domain 84 and, for example, openings 90. First domain 84 can be disposed on first surface 70 and second surface 71 as shown. Relief pattern 92 of openings 90 can have a spatial frequency greater than that of the chemically patterned surface 68. The selective removal process may be carried out by a thermal bake (for thermally decomposable materials), a reactive ion etch process, dissolution in a selective solvent, or a combination thereof. A chemical modification may be accomplished by a variety of known methods. For example, domains may be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain.

Figure 3L:
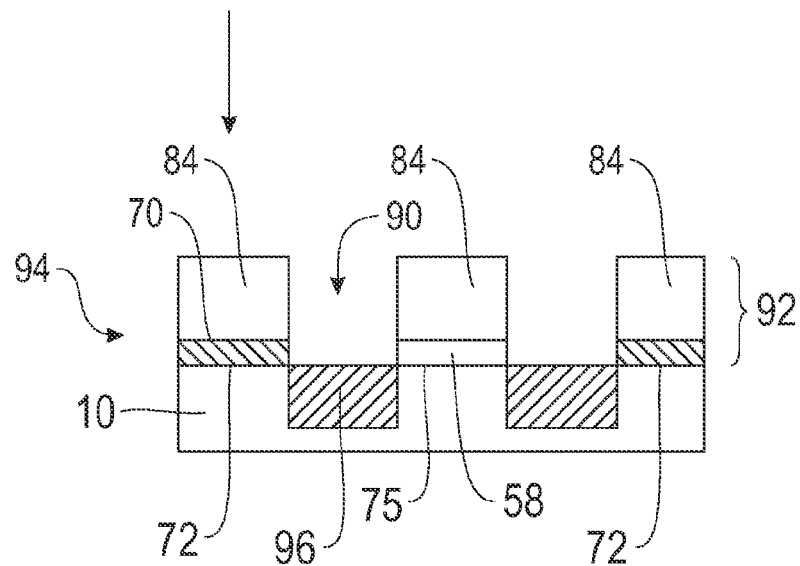

Finally, relief pattern 92 can be transferred to substrate 10, thereby forming altered regions 96 of substrate 10 (FIG. 3L, layered structure 94). Altered regions 96 can be a line, hole, pit, or a chemically altered state of substrate material. Altered regions 96 can extend into one or more layers of substrate 10. The pattern transfer can be accomplished, for example, by using a reactive ion etch process. In one embodiment, the pattern transfer to the underlying substrate is carried out at the same time as the selective removal of one of the domains of SA material.

The above described method forms a sparse chemical pre-pattern derived from a positive-tone photoresist and an orientation control material without employing etching techniques prior to self-assembly of the SA material.

Figure 5:
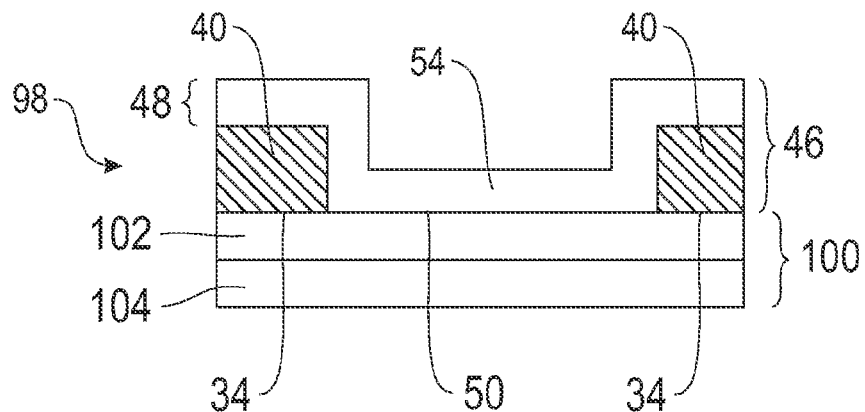
FIG. 5 is a schematic layer diagram corresponding to FIG. 3F, with the exception of having a two-layer substrate rather than a one-layer substrate.

To further illustrate the method using a multi-layered substrate, layered structure 52 of FIG. 3F is reproduced in structure 98 (FIG. 5), with the exception that substrate 100 of layered structure 98 has two layers, a bottom layer 104 and a top layer 102. Bottom layer 104 can be, for example, a silicon wafer. Top layer 102 can be, for example, an ARC layer, where covered surface 34 is a surface of the ARC layer. The transferred relief pattern described above can extend through the top layer into the bottom layer of the substrate if desired.

Similar embodiments based on sparse chemical patterns can be used to fabricate arrays of holes or posts. For example, coating a cylinder-forming BCP film of pitch $P_{BCP}$ (center-to-center distance between nearest cylinders) on a sparse chemical pattern consisting of hexagonally packed pinning dots of pitch, $P_S$, and neutral surface outside the dot areas will allow frequency multiplication of lithographically defined dots. Similar to line-space patterns, the frequency multiplication of hole/post arrays of a factor of $P_S/P_{BCP}$ can be achieved.

Figure 6A:
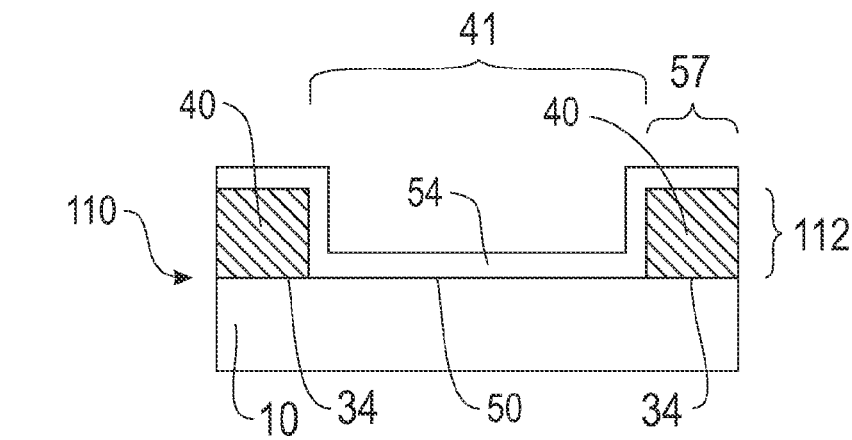
FIGS. 6A to 6E are schematic layer diagrams showing an alternative to the process illustrated in FIGS. 3A to 3L, in which the second development process is omitted. The pre-pattern comprises the surfaces of crosslinked orientation control layer disposed on the treated photoresist pattern.
Figure 6B:
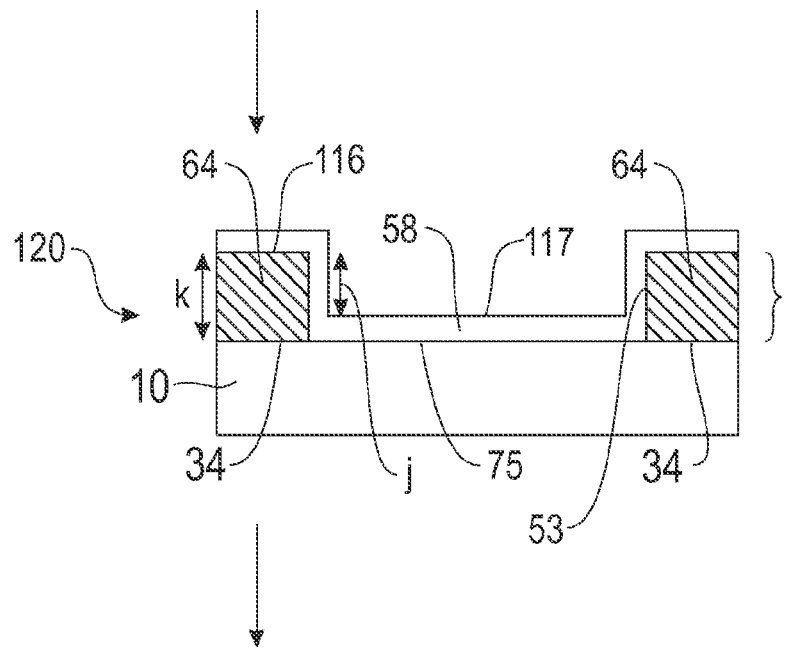
Figure 6C:
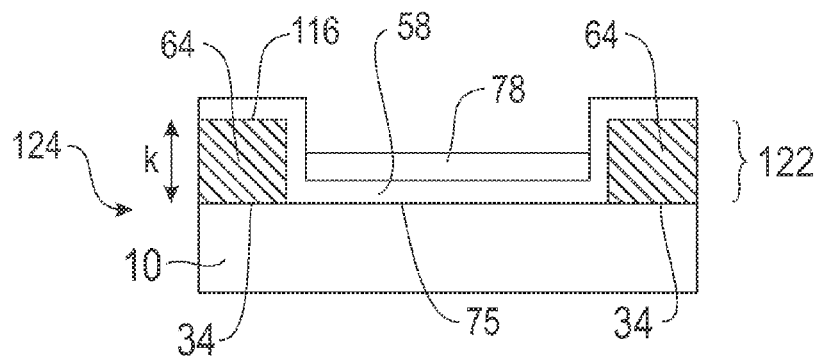
Figure 6D:
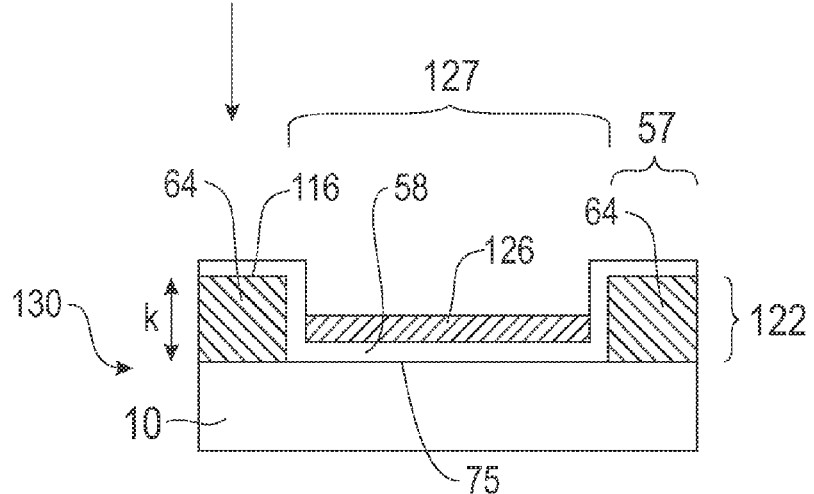
Figure 6E:
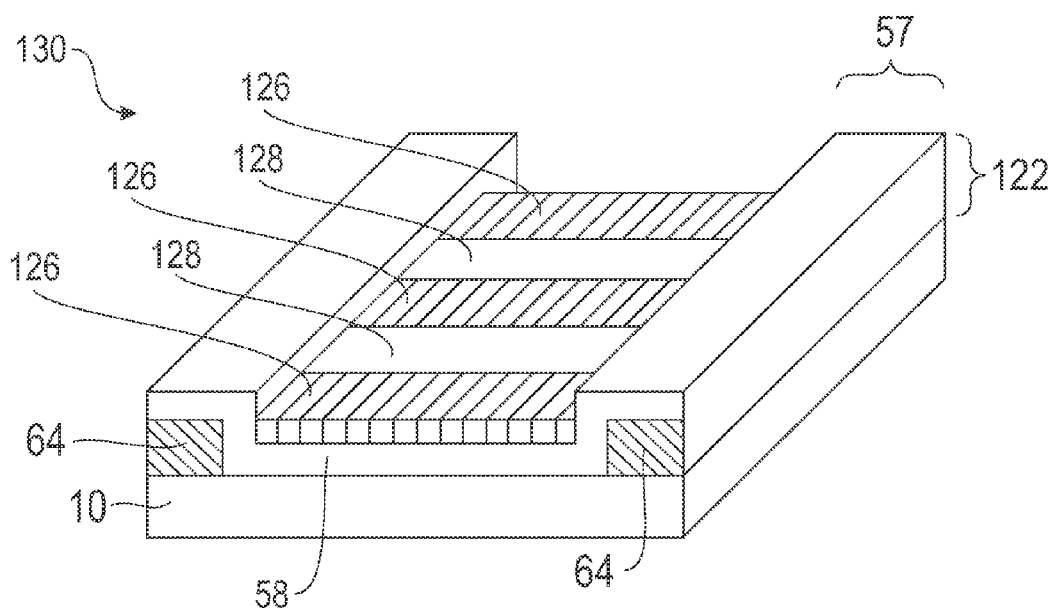

The following describes an alternative embodiment in which a second development process is not used prior to application of the SA material, and is illustrated in the schematic layer diagrams FIGS. 6A to 6E. As shown in structure 110 of FIG. 6A, the orientation control material 54 can be disposed in the trench area 41 and on the sidewall 53 and top surface 116 of treated photoresist 40. Layer 112 also comprises photoresist features 57 comprising treated photoresist 40 as described above. Orientation control material 54 can be thermally treated as before to form thin layer 115 comprising bound orientation control material 58 bound to substrate surface 75 (FIG. 6B, structure 120). Photoresist features 57 of structure 120 are shown having thickness (k). Layer 115 can also comprise non-bound orientation control material 54 (not shown). Structure 120 can be used directly for self-assembly. In this case, the pre-pattern comprises orientation control material top surface 117. Alternatively, non-bound orientation control material 54 may be removed by rinsing with an appropriate solvent (such as the first casting solvent of the orientation control material 54). The pre-pattern can be graphoepitaxial or chemical, depending on the trench height (j) (FIG. 6B), surface properties, and the thickness of the SA material. A solution of SA material dissolved in a solvent is cast on layer 114, and the solvent is removed to form, as a non-limiting example, layer 122 (FIG. 6C, structure 124). In this example SA material 78 is disposed on bound orientation control material 58. SA material 78 is allowed to self-assemble with optional baking and/or annealing (including thermal annealing, thermal gradient annealing, solvent vapor annealing or other gradient field annealing) of the SA material to form a domain pattern 127 comprising, for instance, a first domain 126 and second domain 128 perpendicularly aligned to the photoresist features 57 (FIGS. 6D and 6E, structure 130). FIG. 6E is a plan view of structure 130 showing the alignment of first domain 126 and second domain 128 in trench 41. One of the domains can then be selectively removed in the presence of the other as previously described to create a pattern of, for example, openings that can be transferred to the underlying substrate 10 (not shown).

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein. A substrate comprising a surface affinity material such as a silicon native oxide, silicon oxide, or silicon nitride can be preferentially wetted by, for example, PMMA block components, but not by PS block components of a PS-b-PMMA block copolymer. Therefore, surfaces comprising these surface affinity materials can direct self-assembly of a PS-b-PMMA block copolymer by chemical epitaxy. The substrate can have a top ARC layer or bottom ARC (BARC) layer to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Exemplary orientation control materials include polymers comprising a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)). Other orientation control materials include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers may react as a result of thermal or photochemical treatment either alone or in conjuction with an additional crosslinking agent. In particular, a catalytic species such as a strongly acidic species may be used to facilitate reaction. The strongly acidic species may be directly incorporated into the orientation control material or the solution comprising the orientation control material. Alternatively, a thermal acid generator or photoacid generator molecule may be used to generate an acidic species as a result of thermal or photochemical treatment, respectively. The above materials are particularly suitable for use with an SA material comprising poly(styrene-b-methyl methacrylate) block copolymers. Poly(methyl glutarimide) (PMGI) can be an orientation control material for an SA material comprising poly(styrene-b-ethylene oxide) block copolymer.

Other non-limiting examples of orientation control materials include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components also typically contain a plurality of reactive sites distributed along the polymer for reaction with a crosslinking component. More specific materials used in ARC layers include polymers disclosed in US Patent Application 20090186294, including poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl end-capped poly(bisphenol A-co-epichlorohydrin), and silicon-containing anti-reflection coating A940 from Shin Etsu. Another more specific orientation control material described in U.S. Pat. No. 7,521,090 comprises poly(styrene-co-epoxydicyclopentadiene methacrylate) random copolymer, P(S-r-EDCPMA):

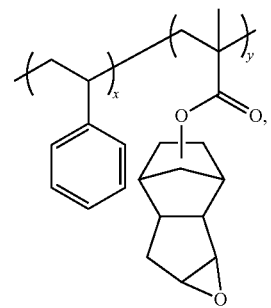

P(S-r-EDCPMA)

wherein x and y are each integers greater than 1. Other orientation control materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinnammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other orientation control materials comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity materials. Other orientation control materials include self-assembled monolayers.

The photoresist layer is prepared by disposing a photoresist composition on a substrate. The photoresist composition comprises a photoresist and optionally selected additives that do not adversely affect the desirable properties of the treated photoresist, such as its preferential wetting properties with the SA material, dimensional stability, and insolubility in the casting solvent for the orientation control material or the SA material. Exemplary optional additives include photo-acid generator, thermal acid generator, acid amplifier, photobase generator, thermal base generator, photo-destructible base, surfactant, solvent, base quencher, sensitizer, and combinations of the foregoing additives.

The photoresist can comprise a polymer having repeating units derived from one or more monomer units, in particular a tertiary ester moiety. The polymer can be a copolymer, a terpolymer, or a tetrapolymer. Examples of tertiary ester moieties include those that can be deprotected by an acid generated from a photoacid generator (PAG) such as those disclosed in U.S. Pat. No. 4,491,628, "Positive- and Negative-working Resist Compositions with Acid Generating Photoinitiator and Polymer with Acid Labile Groups Pendant From Polymer Backbone" to H. Ito, et al. Non-limiting examples of tertiary ester moieties include ester derivatives of structural groups such as: methyladamantane, ethyladamantane, methylcyclopentane, ethylcyclopentane, methylcyohexane, ethylcycohexane, methylcycloheptane, ethylcycloheptane, methylcyclooctane, and ethylcyclooctane. Other tertiary esters include trityl esters, isobornyl esters, dicyclopropylmethyl esters, dimethylcyclopropylmethyl esters and t-butyl esters. Repeating units can comprise a wide range of other acid labile groups, including for example, tertiary carbonates of phenols, benzyl esters, benzyhydryl esters, acetals, ketals, trialkylsilyl esters such as trimethylsilyl ester, tetrahydrofuranyl esters, tetrahydropyranoyl esters, 3-oxocyclohexanonyl, and mevalonic lactonyl esters, and the like. The polymer can also have repeating units containing a lactone moiety in combination with repeating units containing at least one acid labile moiety, where such a configuration can impart good lithographic performance to the photoresist. When desirable, lactone moieties can improve dissolution in aqueous developer. Examples of repeating units containing lactones moieties include 5-methacryloyloxy-2,6-norbornanecarbo-gamma-lactone, 3-methacryloyloxymethyl-2,6-norbornanecarbo lactone, 3-acryloyloxymethyl-2,6-norbornanecarbo lactone, alpha-acryloyloxy-gamma-butyrolactone, alpha-methacryloyloxy-gamma-butyrolactone, beta-acryloyloxy-gamma-butyrolactone and beta-methacryloyloxy-gamma-butyrolactone.

Photoresists for deep ultraviolet (DUV), extreme ultraviolet (EUV), and e-beam exposures can also comprise, for example, functional silsesquioxanes, tetrathiafulvalenes, tetraselenafulvalenes, and electroactive repeating units derived from, for example, styrene, chloro-methylated styrene, glutamic acid, vinyl chloride, epichlorohydrins, alpha halophosphazenes, and acrylic chloride. Other examples of suitable chemically-amplified resists for use at 248 nm, 193 nm, 157 nm, EUV, and e-beam lithography can be found in Ito in "Chemical Amplification Resists for Microlithography" Adv. Polym. Sci., vol. 172, pp. 37-245 (2005).

The photoresist can also comprise a blend of two or more polymers. In particular, the photoresist is a non-crosslinking, photoresist capable of chemical amplification.

More specific positive-tone resists include JSR AM2073J (a commercial non-crosslinking, positive-tone, 193 nm photoresist capable of chemical amplification), JSR AR2928JN (a commercial non-crosslinking, positive-tone, 193 nm photoresist capable of chemical amplification), and poly(t-butyloxycarbonyloxystyrene-co-methyl methacrylate) P(BOCST-r-MMA), a 248 nm/e-beam photoresist capable of chemical amplification.

A photosensitive acid generator (PAG) is capable of releasing or generating acid upon exposure to radiation. Exemplary PAGs include, for example, (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, and combinations thereof.

A thermal acid generator (TAG) is capable of releasing or generating acid upon heating. Exemplary thermal acid generators include diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts, and sulfonic ester compounds such as cyclohexyl p-toluenesulfonate, cyclohexyl propanesulfonate, cyclohexyl methanesulfonate, cyclohexyl octanesulfonate, cyclohexyl camphorsulfonate, and combinations thereof.

An acid amplifier is a compound that is decomposed with an acid to generate an acid. For these compounds, reference should be made to J. Photopolym. Sci. and Tech., 8, 43-44, 45-46 (1995), and J. Photopolym. Sci. and Tech., 9, 29-30 (1996). Non-limiting examples of acid amplifiers include tert-butyl-2-methyl-2-tosyloxymethyl acetoacetate and 2-phenyl-2-(2-tosyloxyethyl)-1,3-dioxolane. Of well-known photoacid generators, many of those compounds having poor stability, especially poor thermal stability, and exhibit an acid amplifier-like behavior.

A photobase generator (PBG) generates a base upon exposure to radiation. Photobase generators include quaternary ammonium dithiocarbamates, alpha aminoketones, oxime-urethane containing molecules such as dibenzophenone-oxime hexamethylene diurethane, ammonium tetraorganylborate salts, N-(2-nitrobenzyloxycarbonyl) cyclic amines, and combinations thereof.

A photo-destructible base (PDB) is a base that by exposure to radiation is converted into a species that does not interfere with an acid. For example, triphenylsulfonium hydroxide (TPSH), upon exposure, is converted into water and neutral organic species.

A thermal base generator (TBG) forms a base upon heating above a first temperature, T. T can be a temperature of about 140° C. or greater, such as 140° C. to 260° C. The thermal base generator can comprise a functional group selected from the group consisting of amide, sulfonamide, imide, imine, O-acyl oxime, benzoyloxycarbonyl derivative, quarternary ammonium salt, nifedipine, carbamate, and combinations thereof. Exmplary thermal base generators include o-{(.beta.-(dimethylamino)ethyl)aminocarbonyl}benzoic acid, o-{(.gamma.-(dimethylamino)propyl) aminocarbonyl}benzoic acid, 2,5-bis{(.beta.-(dimethylamino)ethyl)aminocarbonyl}terephthalic acid, 2,5-bis{(.gamma.-(dimethylamino)propyl) aminocarbonyl}terephthalic acid, 2,4-bis{(.beta.-(dimethylamino)ethyl)aminocarbonyl}isophthalic acid, 2,4-bis{(.gamma.-(dimethylamino)propyl) aminocarbonyl}isophthalic acid, and combinations thereof.

The photoresist composition can further comprise a surfactant. Surfactants can be used to improve coating uniformity, and can include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Dow Chemical.

The photoresist composition can include a solvent to dissolve the other components, so that the photoresist can be disposed evenly on the surface of the substrate to provide a defect-free coating. Non-limiting examples of solvents include ethers, glycol ethers, aromatic hydrocarbons, ketones, esters, ethyl lactate, gamma-butyrolactone, cyclohexanone, ethoxyethylpropionate (EEP), a combination of EEP and gamma-butyrolactone (GBL), propylene glycol methyl ether acetate, and mixtures thereof.

Exemplary base quenchers comprise aliphatic amines, aromatic amines, carboxylates, hydroxides, or combinations thereof. For example, base quenchers can include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines. Tetra alkyl ammonium hydroxides or cetyltrimethyl ammonium hydroxide can be used as a base quencher when the PAG is an onium salt.

Sensitizers include polycyclic aromatics such as pyrene, perylene, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, and combinations thereof.

The photoresist composition can comprise about 1% by weight (wt. %) to about 30 wt. % of photoresist based on the total weight of the photoresist composition, more particularly about 2 wt. % to about 15 wt. %.

The photoresist composition can comprise from about 0.5 wt. % to about 20 wt. % of a photoacid generator based on the weight of the photoresist in the photoresist composition, more particularly from about 0.5 wt. % to about 10 wt. % based on the weight of the photoresist in the photoresist composition.

The photoresist composition can comprise from about 0.01 wt. % to about 30 wt. % thermal acid generator based on the weight of the photoresist in the photoresist composition, more particularly from about 0.1 wt. % to about 20 wt. %.

The photoresist composition can comprise from about 0.01 wt. % to about 30 wt. % acid amplifier based on the weight of the photoresist in the photoresist composition, more particularly from about 0.1 wt. % to about 20 wt. %.

The photoresist composition can comprise from about 0.01 wt. % to about 30 wt. % photobase generator based on the weight of the photoresist in the photoresist composition, more particularly from about 0.1 wt. % to about 20 wt. %.

The photoresist composition can comprise from about 0.01 wt. % to about 30 wt. % thermal base generator based on the weight of the photoresist in the photoresist composition, more particularly from about 0.1 wt. % to about 20 wt. %.

The photoresist composition can comprise from about 0.01 wt. % to about 30 wt. % photo-destructible base based on the weight of the photoresist in the photoresist composition, more particularly from about 0.1 wt. % to about 20 wt. %.

The photoresist composition can further include about 0.001 wt. % to about 0.1 wt. % of surfactant based on the total weight of photoresist in the photoresist composition.

The photoresist composition can comprise from about 70 wt. % to about 99 wt. % solvent based on the total weight of the photoresist composition, more particularly from about 85 wt. % to about 98 wt. %.

The photoresist composition can further include about 0.01 wt. % to about 1.0 wt. % of base quencher based on the total weight of the photoresist in the photoresist composition.

The photoresist composition can comprise from about 0.01 wt. % to about 30 wt. % sensitizer based on the weight of the photoresist in the photoresist composition, more particularly from about 0.1 wt. % to about 20 wt. %.

The photoresist layer can be formed by processes such as spin coating, spray coating, dip coating, doctor blading, roll coating, and the like, which can be used individually or in combinations thereof in accordance with the methods of the present invention. More particularly, a solution of the photoresist in a suitable solvent is spin cast onto the surface of the substrate, followed by removal of the solvent to produce the photoresist layer. The photoresist layer can have a thickness of, for example, from 1 nm to 200 nm, more particularly 5 nm to 150 nm, and even more particularly 5 nm to 100 nm. The photoresist layer can be given a post-apply bake at a temperature of, for example, from 50° C. to 300° C., more particularly 50° C. to 200° C. The post-apply bake can conducted for a period of, for example, a least 1 sec, 1 sec to 1 hour, more particularly 1 sec to 5 minutes.

Pattern-wise exposure of the photoresist layer can be accomplished using radiation of various types, including ultraviolet (UV) radiation of wavelengths from 400 nm to 300 nm, deep ultraviolet (DUV) radiation of wavelengths from 300 nm to 150 nm, extreme ultraviolet (EUV) radiation of wavelengths from 120 nm to 4 nm, electron-beam (e-beam) radiation, x-ray radiation, and combinations of the foregoing. DUV and EUV exposures employ a specific mask to generate patterns in the positive tone photoresist layer. E-beam lithography (e.g., projection e-beam lithography, e-beam direct write lithography, parallel e-beam lithography), writes patterns directly to the photoresist. Exemplary radiation sources include single wavelength and/or narrow band radiation sources, specific mercury emission lines, lasers, and particle beam emitters. For less stringent conditions, a broad band multiple wavelength source can be used. More specifically, the radiation wavelength for the pattern-wise exposure can be, for example, 405 nm, 313 nm, 334 nm, 257 nm, 248 nm, 193 nm, 157 nm, 126 nm, or 13.5 nm. Even more particularly, the wavelength of the radiation for the pattern-wise exposure can be less than 250 nm. In an embodiment, the radiation wavelength is selected from the group consisting of 248 nm, 193 nm, 157 nm, and 13.5 nm. In another embodiment, the photoresist is exposed pattern-wise through a photomask using deep ultraviolet radiation with a wavelength less than 250 nm. In particular, the pattern-wise exposure can be accomplished by 193 nm immersion lithography using water as an immersion fluid. In order to accommodate patterning by 193 nm water immersion lithography, a protective topcoat layer can be applied to the surface of the photoresist prior to exposure via immersion lithography. Preferably, the topcoat layer is base-soluble and is removed during the photoresist development step by the alkaline photoresist developer. Alternatively, the photoresist can comprise surface-active components that control the surface properties of the coated photoresist and limit the extraction of photoresist components into the immersion fluid.

The pattern-wise exposed photoresist layer can be developed in an aqueous alkaline developer due to the polarity increase induced by the exposure. An optional post-exposure bake can further amplify the formation of polar functional groups in the exposed areas. In the case of a positive-tone photoresist, development with an aqueous alkaline developer selectively removes the exposed photoresist leaving a patterned photoresist comprising non-exposed photoresist disposed on a first surface of the substrate. A second area of the surface of the substrate has substantially no photoresist disposed thereon.

An optional post-development bake can further tailor the properties of the patterned photoresist. The bake can be conducted at a temperature from 50° C. to 300° C. for a period of a least 1 sec, more particularly from 1 sec to 1 hour.

SA materials are comprised of immiscible materials that can phase segregate into domains. Phase segregation can be found in different types of polymer blends (e.g., binary, ternary) as well as block copolymers comprising two or more different polymeric block components.

SA materials for directed self-assembly can comprise immiscible polymer blends. The term "immiscible" as used herein refers to two or more polymers in the polymer blend being incompatible enough to drive phase segregation under certain process conditions. The immiscibility of the polymers in the polymer blends can depend on the composition as well as the film forming process of the polymer blends. The ratio of the polymers, molecular weight of the individual polymers in the blend, and the presence of other additional components in the blend can be used to adjust the compatibility of the polymers in the polymer blend. Temperature, coating conditions, the treated photoresist topography, treated photoresist surface properties, and substrate surface properties can also affect the phase segregation of the polymers. As used herein, an "immiscible polymer" is a polymer that in a polymer blend composition phase segregates on a properly prepared substrate surface under appropriate process conditions.

Examples of suitable polymers for the two or more immiscible polymers include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly (styrene sulfonic acid), poly(vinyl phosphoric acid), poly (vinyl sulfonic acid), poly(2-sulfoethyl methacrylate), poly (2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethane sulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly (isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluoro sulfonamide polymers, poly(2,2,2-trifluoroethyl methacrylate), poly (hexafluoroisopropyl methacrylate), poly(2,3,4,5,6-pentafluorostyrene), and substituted derivatives thereof. The two or more immiscible polymers can be selected such that each polymer is immiscible with each other polymer in the blend.

The SA material can comprise a block copolymer, or blends of block copolymers and other polymers. In an embodiment, the block copolymer consists essentially of a first polymeric block component A and a second polymeric block component B that are immiscible with each other. Typically, homopolymers of suitable immiscible block components form a blend that exhibits multiple glass transition temperatures representing each homopolymer phase. Preferably, one of the components A and B is selectively removable without having to remove the other, so as to form isolated and orderly arranged structural units composed of the un-removed component, or a continuous structural layer containing isolated and orderly arranged cavities formed after the removable component has been removed. Alternatively, the components A and B can simply have different electrical, optical, and/or magnetic properties, so that the ordered patterns composed of such components A and B can be used for fabricating different device structures.

The block copolymer can comprise blocks comprising one or more monomers, and at least two blocks in the block copolymer are compositionally, structurally, or both compositionally and structurally non-identical. Suitable block copolymers include di-block copolymers, tri-block copolymers, or multi-block copolymers, any of which can be used in conjunction with DSA to further enhance the resolution. The blocks themselves can be homopolymers, or copolymers, including terpolymers. The SA material can comprise an amphiphilic organic block copolymer, amphiphilic inorganic block copolymer, organic di-block copolymer, organic multi-block copolymer, inorganic-containing di-block copolymer, inorganic-containing multi-block copolymer, linear block copolymer, star block copolymer, dendritic block copolymer, hyperbranched block copolymer, graft block copolymer, or a combination comprising at least one of the foregoing block copolymers. In an embodiment, the block copolymer is a di-block copolymer. Combining a suitable tri-block copolymer and a chemical pre-pattern can, for example, be used to quadruple the spatial frequency of the chemical pre-pattern.

The block components can in general be any appropriate microdomain-forming block that can be copolymerized with, attached to, or self-organize with another dissimilar block. Blocks can be derived from different polymerizable monomers, where the blocks can include but are not limited to: polyolefins including polydienes, polyethers including poly (alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise repeating units derived from $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or alpha-methylstyrene; and can include as (meth)acrylate monomers, methyl(meth)acrylate, ethyl(meth)acrylate, n-propyl(meth)acrylate, isopropyl (meth)acrylate, n-butyl(meth)acrylate, isobutyl(meth)acrylate, n-pentyl(meth)acrylate, isopentyl(meth)acrylate, neopentyl(meth)acrylate, n-hexyl(meth)acrylate, cyclohexyl (meth)acrylate, isobornyl(meth)acrylate, or hydroxyethyl (meth)acrylate. Combinations of two or more of these monomers can be used. Exemplary blocks that are homopolymers include blocks prepared using styrene (i.e., polystyrene blocks), or (meth)acrylate homopolymer blocks such as poly (methyl methacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride dyad repeating structure due to the inability of maleic anhydride to homopolymerize under most conditions (e.g., poly(styrene-alt-maleic anhydride)) where "-alt-" indicates alternating polymeric blocks. It is understood that such blocks are exemplary and should not be considered to be limiting.

More specific di-block or tri-block copolymers include poly(styrene-b-vinyl pyridine) (PS-b-PVP), poly(styrene-b-butadiene) (PS-b-PBD), poly(styrene-b-isoprene) (PS-b-PI), poly(styrene-b-methyl methacrylate) (PS-b-PMMA), poly(styrene-b-alkenyl aromatics), poly(isoprene-b-ethylene oxide) (PI-b-PEO), poly(styrene-b-(ethylene-propylene)), poly(ethylene oxide-b-caprolactone), poly(butadiene-b-ethylene oxide) (PBD-b-PEO), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane) (PS-b-PDMS), poly(styrene-b-ferrocenyldimethylsilane) (PS-b-PFS), poly(styrene-b-isoprene-b-ethylene oxide) (PS-b-PI-b-PEO), poly(styrene-b-isoprene-b-methyl methacrylate) (PS-b-PI-b-PMMA), poly(styrene-b-ferrocenyldimethylsilane-b-isoprene) (PS-b-PFS-b-PI), or a combination comprising at least one of the foregoing block copolymers.

The polymer blend or block copolymers can also comprise inorganic constituents, including inorganic-containing homopolymers, copolymers, and block copolymers, and inorganic-containing monomers, molecules, and additives. These include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers", Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films", *Nano Letters*, vol. 5, 2014 (2005); and exemplary metal-containing molecules and additives include those disclosed by Jinan Chai, Dong Wang, Xiangning Fan, and Jillian M. Buriak, "Assembly of aligned linear metallic patterns on silicon", *Nature Nanotechnology*, vol. 2, p. 500, (2007).

The block copolymer desirably has an overall molecular weight and polydispersity amenable to further processing. In an embodiment, the block copolymer has a weight-averaged molecular weight ($M_w$) of 3,000 to 200,000 g/mol. Similarly, the block copolymer has a number averaged molecular weight ($M_n$) of 1,000 to 80,000. The block copolymer can also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards.

The block copolymers can be prepared by methods previously described in the art, including living polymerization techniques such as atom transfer free radical polymerization (ATRP) nitroxide-mediated radical polymerization, ring-opening metathesis polymerization (ROMP), and living cationic or living anionic polymerizations.

In a particular embodiment, the block copolymer used for forming the self-assembled periodic patterns is PS-b-PMMA. The PS and the PMMA blocks in such a PS-b-PMMA block copolymer can have a total (summed over all blocks) number average molecular weight ($M_n$) ranging from about 5 kg/mol to about 300 kg/mol, with a total number average molecular weight from about 10 kg/mol to about 100 kg/mole being more typical. Each block can have a $M_n$ of 1 to 299 kg/mol, more particularly 1 to 99 kg/mol.

The morphology (shape, dimension, orientation) of the self-assembled domains from block copolymer thin films is a function of composition (material, molecular weight, volume ratio of different blocks), annealing condition (temperature, environment, annealing time), the interface properties (polymer-air interface, polymer substrate interface) as well as the defined geometry (film thickness, topography of the confinement). Therefore, by adjusting one or more parameters, the morphology can be adjusted to the need of specific applications.

In order to form the self-assembled periodic patterns, the block copolymer can be first dissolved in a suitable solvent system to form a block copolymer solution, which can then be applied onto the treated layer, thereby forming a thin block-copolymer layer disposed thereon. Optionally annealing the thin block-copolymer layer can aid in the self-assembly process of the polymeric block components.

In order to form the self-assembled periodic patterns, the block copolymer can be first dissolved in a suitable solvent system to form a block copolymer solution, which can then be applied onto the pre-pattern, thereby forming a thin block-copolymer layer disposed thereon. Optionally annealing the thin block-copolymer layer can aid in the self-assembly process of the polymeric block components.

In an embodiment, the SA material comprises at least one block copolymer. The organic solvent should fully dissolve all SA materials, but should not dissolve the treated photoresist. In an embodiment, the solvent used to develop the exposed photoresist layer is the solvent used to form the solution of the SA material. Non-limiting exemplary solvents for the SA material include substituted or unsubstituted aromatic hydrocarbons, substituted or unsubstituted aromatic ethers, substituted or unsubstituted aromatic alcohols, saturated monoalcohols comprising 5 to 20 carbons, glycols, ketones, glycol mono ethers, and glycol mono ether esters. In an embodiment, the SA solvent is a glycol, glycol mono ether, or glycol mono ether ester, or combinations thereof. More specific solvents for the SA material include but are not limited to toluene, ethylene glycol, propylene glycol, propylene glycol monomethyl ether acetate (PGMEA), propylene glycol monomethyl ether (PGME), 4-methyl-2-pentanol, n-butyl acetate, anisole, acetone, and combinations thereof. In an embodiment, the solvent for the SA material is ethylene glycol, propylene glycol, propylene glycol monomethyl ether acetate (PGMEA), propylene glycol monomethyl ether (PGME), 4-methyl-2-pentanol, or combinations thereof. The solution of SA material can have a concentration ranging from about 0.1 weight percent (wt. %) to about 5 wt. % SA material based on total weight of the solution. More particularly, the SA material is dissolved at a concentration ranging from about 0.5 wt. % to about 2.5 wt. %. In an embodiment, the solution of SA material comprises about 0.5 wt. % to about 2.5 wt. % PS-b-PMMA block copolymer dissolved in anisole. The solution of SA material can optionally further comprise additional block copolymers, homopolymers, random copolymers, surfactants, and photoacid generators, photobase generators, thermal acid generators, thermal base generators, acid amplifiers, and photodestructible bases.

The solution of SA material is cast on the pre-pattern followed by removal of the solvent, thereby forming a thin film of the SA material (i.e., SA layer) disposed on one or more surfaces of the pre-pattern. In an embodiment, the SA material is substantially disposed in the trench of the treated layer. The solution of SA material can be cast by any suitable technique, including, but not limited to: spin coating, roll coating, spraying, ink coating, dip coating, and the like. Additional annealing (including thermal annealing, thermal gradient annealing, solvent vapor annealing or other gradient field) can be optionally employed to remove defects in the SA layer and/or promote self-assembly of the SA material. More particularly, the SA layer comprising a block copolymer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 100° C. to about 300° C. The thermal annealing can be performed for a period of more than 0 hours to about 100 hours, and more particularly for about 1 hour to about 15 hours. The thermally annealed block copolymer self-assembles to form ordered domains whose orientation can be perpendicular to the underlying surface plane. In general, the SA material can have a thickness of 100 to 10000 angstroms, more particularly 200 to 5000 angstroms, and even more particularly 300 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

Also disclosed is the layered structure formed by the above-described method. In an embodiment, the layered structure is a semiconductor device. The method can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

The above-described methods permit a photoresist feature width of from 1 to 1000 nm, from 1 to 500 nm, from 1 to 300 nm, from 1 to 200 nm, from 1 to 150 nm, or more particularly from 1 to 100 nm. When the SA material is a block copolymer or blend containing a block copolymer, the method advantageously allows domain patterns having reduced feature width and increased periodicity relative to the photoresist feature. In this case, the domain feature width can be from 1 to 50 nm, from 1 to 30 nm, or more particularly from 1 to 20 nm. When the SA material is an immiscible polymer blend, the method permits a photoresist feature size less than 200 nm, more particularly less than 150 nm, and even more particularly less than 100 nm. The domain feature sizes tend to be larger, ranging from 1 to 500 nm, from 1 to 250 nm, or more particularly from 1 to 150 nm. Secondly, the method advantageously utilizes a self-assembled material with reduced feature size and an increased the periodicity relative to the pre-pattern.

The following non-limiting examples are provided to further illustrate the disclosed methods.

EXAMPLES

Materials used in the following examples are listed in Table 1.

TABLE 1

| Material | Description | Company |
| --- | --- | --- |
| TCX-041 | 193 nm immersion topcoat | JSR |
| AR2746J | 193 nm non-crosslinking positive-tone photoresist capable of chemical amplification | JSR |
| AR2928JN | 193 nm non-crosslinking positive-tone photoresist capable of chemical amplification | JSR |
| ARC-29A | Bottom anti-reflection coating | Brewer Science |
| A940 | Si-containing bottom anti-reflection coating | Shin Etsu |
| TMAH | 0.26N Tetramethylammonium hydroxide developer solution; OPTIYIELD CD | Fuji Film |
| PS-b-PMMA | Poly(styrene-b-methyl methacrylate) block copolymer; | Polymer Source Inc. |
| PS-b-PMMA (37k-37k) | Poly(styrene-b-methyl methacrylate) block copolymer; $M_n$ = 37k of each block; | Polymer Source Inc. |
| PS-b-PMMA (22k-22k) | Poly(styrene-b-methyl methacrylate) block copolymer; $M_n$ = 22k of each block; | Polymer Source Inc. |
| PS-b-PMMA (18k-18k) | Poly(styrene-b-methyl methacrylate) block copolymer; $M_n$ = 18k of each block; | Polymer Source Inc. |
| P(S-r-MMA) | Hydroxyl-terminated poly(styrene-co-methyl methacrylate) random copolymer, S:MMA = 58:42 by mole, $M_n$ = 9 kg/mol | IBM (non-commercial) |

TABLE 1-continued

| Material | Description | Company |
|---|---|---|
| P(S-r-MMA-r-EDCPMA) | Poly(styrene-co-methyl methacrylate-co-epoxydicyclopentadiene methacrylate) random copolymer (ratio of S:MMA:EDCPMA = 57:39:4 by mole, $M_n$ = 12.3 kg/mol | IBM (non-commercial) |
| P(S-r-MMA-r-GMA) | Poly(styrene-co-methyl methacrylate-co-glycidylmethacrylate) random copolymer (ratio of S:MMA:GMA = 56:42:2 by mole, $M_n$ = 12.1 kg/mol | IBM (non-commercial) |
| P(S-r-EDCPMA) | poly(styrene-co-epoxydicyclopentadiene methacrylate) random copolymer (S:EDCPMA = 70:30 by mole, $M_n$ = 7k | IBM (non-commercial) |

Preparation of P(S-r-MMA-r-EDCPMA).

Poly(styrene-co-methyl methacrylate-co-epoxydicyclopentadiene methacrylate) random copolymer was prepared by free-radical polymerization of styrene, methyl methacrylate, and epoxydicyclopentadiene methacrylate in a molar feed ratio of 58:37:5 (isolated polymer composition: 57:39:4 as determined by $^{13}C$ NMR) according to the method described in U.S. Pat. No. 7,521,090. $M_n$=12.3 kg/mol. PDI: 1.55.

Preparation of Orientation Control Material P(S-r-MMA-r-GMA).

Poly(styrene-co-methyl methacrylate-co-glycidyl methacrylate) random copolymer was prepared by free-radical polymerization of styrene, methyl methacrylate, and epoxydicyclopentadiene methacrylate in a molar feed ratio of 58:40:2 (isolated polymer composition: 56:42:2 as determined by $^{13}C$ NMR). $M_n$=12.1 kg/mol. PDI: 1.59.

Preparation of Orientation Control Material P(S-r-EDCPMA).

Poly(styrene-co-epoxydicyclopentadiene methacrylate) random copolymer was prepared by free-radical polymerization of styrene and epoxydicyclopentadiene methacrylate in a mole ratio of 70:30 according to the method described in U.S. Pat. No. 7,521,090. $M_n$=7400 g/mol. PDI: 1.40.

Example 1

Developer Selectivity

A two-layer substrate was prepared having a 780 Å thick anti-reflection layer (ARC-29A, Brewer Science) disposed on a silicon wafer. A 150 nm thick layer of a commercial 193 nm positive-tone photoresist (JSR AR2746J) was disposed on the anti-reflection layer, forming a three-layered structure. The structure was given a post-apply bake (PAB) at 130° C. for 60 sec. A 5×25 dose array of open field exposures was imaged on the material using a 193 nm mini-stepper (0.6 numerical aperture (NA)). A post-exposure bake (PEB) was performed at 125° C. for 60 sec and the thickness measured using a Nanometrics Nanospec 6100. The photoresist pattern was then developed 30 seconds in one of the following developers: anisole, ethylene glycol (EG), 0.26N tetramethyl ammonium hydroxide (TMAH, OPTIYIELD® CD from Fuji Film), PGMEA, or anisole: PGMEA (9:1). After development, the wafer was spin dried and the residual thickness was again measured. The selectivity of each developer in dissolving exposed and/or non-exposed photoresist is shown graphically in the contrast development curves of FIG. 4A (thickness of developed layer plotted against exposure dosage in mJ/cm$^2$ for each developer). The procedure was repeated for another commercial 193 nm positive-tone chemically-amplified photoresist, JSR AR2928JN. The results are graphically shown in FIG. 4B (118 nm thickness, PAB: 120° C. for 60 sec, PEB: 115° C. for 60 sec, 30 sec development). The curve with the small open square in FIGS. 4A and 4B is the latent film thickness after exposure and post-exposure bake. In each case, anisole preferentially dissolved the non-exposed photoresist, TMAH dissolved the exposed photoresist, and EG dissolved neither exposed nor non-exposed photoresist. PGMEA dissolved both exposed and non-exposed JSR AR2746J photoresist and the non-exposed JSR 2928JN photoresist, but only dissolved a significant portion of the exposed JSR 2928JN photoresist at higher exposure doses.

Example 2

Figure 7A:
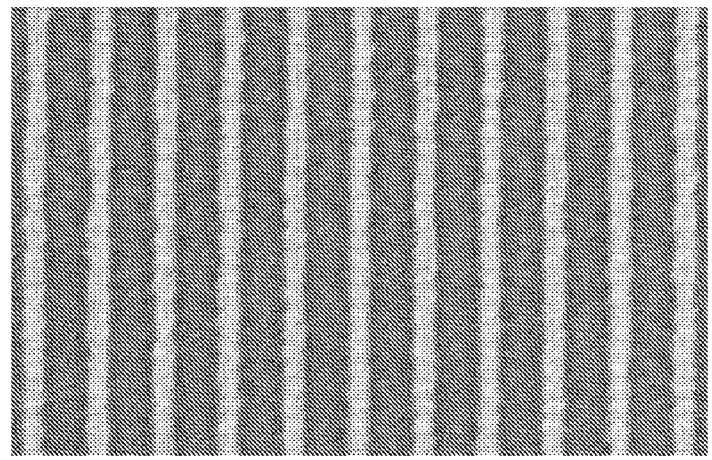
FIG. 7A is a scanning electron micrograph (SEM) image of the photoresist line-space pattern with a pitch of 90 nm formed by 193 nm immersion interference lithography of Example 2.
Figure 7B:
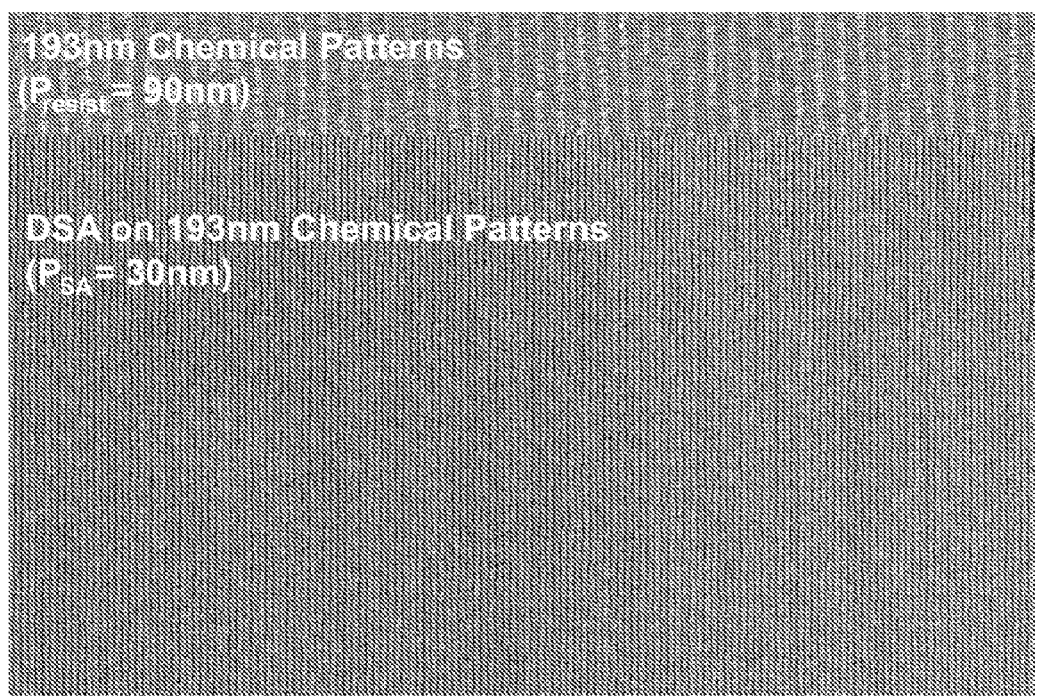
FIG. 7B (top) is a SEM micrograph of the sparse chemical pattern of Example 2.

A 50 nm thick layer of a commercial 193 nm positive-tone photoresist (JSR AR2928JN) was disposed on a substrate comprising a silicon wafer bottom layer and a 780 angstrom thick anti-reflection layer of ARC-29A (Brewer Science), as described for Example 1. The photoresist layer was baked at 120° C. for 60 sec. The photoresist layer was then exposed using a 193 nm immersion interference tool (IBM NEMO) using water as an immersion fluid, baked at 115° C. for 60 sec, and developed for 60 sec using 0.26N TMAH developer (OPTIYIELD® CD from Fuji FILM). The resulting 90 nm pitch patterned photoresist layer was then flood exposed (100 mJ/cm$^2$) using a 254 nm Hg/Xe arc lamp (Ushio America UXM-5001MA) and baked at 115° C. for 60 sec. A SEM micrograph of the resulting treated photoresist layer (brighter lines are the treated photoresist) is shown in FIG. 7A. A 1 wt % solution of an orientation control material, based on total weight of the solution, was prepared by dissolving hydroxyl-terminated poly(styrene-co-methyl methacrylate) random copolymer, P(S-r-MMA), $M_n$=9 kg/mol, in anisole. The ratio of styrene: methyl methacrylate in the random copolymer was 58:42 by mole. The solution was spin coated onto the treated photoresist layer, the solvent was removed, and the resulting structure was baked at 200° C. for 30 minutes to ensure adequate grafting of the P(S-r-MMA) brush layer to the surface of the anti-reflection layer in the trench areas of the treated photoresist layer. The treated photoresist was then removed using a rinse of 0.26N TMAH developer. Any non-grafted hydroxyl-terminated poly(styrene-co-methyl methacrylate) was then removed by a rinse with anisole. The SEM micrograph of the resulting chemical pre-pattern after the TMAH and anisole rinse is shown in the upper portion of FIG. 7B, where the brighter lines are the residual treated photoresist material and the darker regions comprise hydroxyl-terminated poly(styrene-co-methyl methacrylate) grafted to the underlying ARC. An anisole solution was prepared containing 1.5 wt %, based on total weight of the solution, of a blend of two block copolymers, PS-b-PMMA (37k-37k) and PS-b-PMMA (18k-18k). The dry blend weight ratio of PS-b-PMMA (37k-37k):PS-b-PMMA (18k-18k) was 85:15. The polymer blend solution was spin coated on the chemical pre-pattern and was annealed at 240° C. for 5 minutes. Some of the PMMA domains locate on the pinning regions (which are comprised of the residual treated photoresist material) of the chemical pre-pattern, forming a domain pattern of alternating perpendicularly-oriented lamellar PS/PMMA domains aligned to the pinning region. In order to visualize the resulting domain morphology, the self-assembled PMMA domains were selectively removed using an oxygen reactive ion etch process ($O_2$-dscum program for 10 sec). A SEM micrograph of the resulting frequency tripling line-space pattern formed by the PS domains is shown in the lower portion of FIG. 7B (brighter lines). The pitch of the polystyrene lines is 30 nm.

Example 3

Figure 8A:
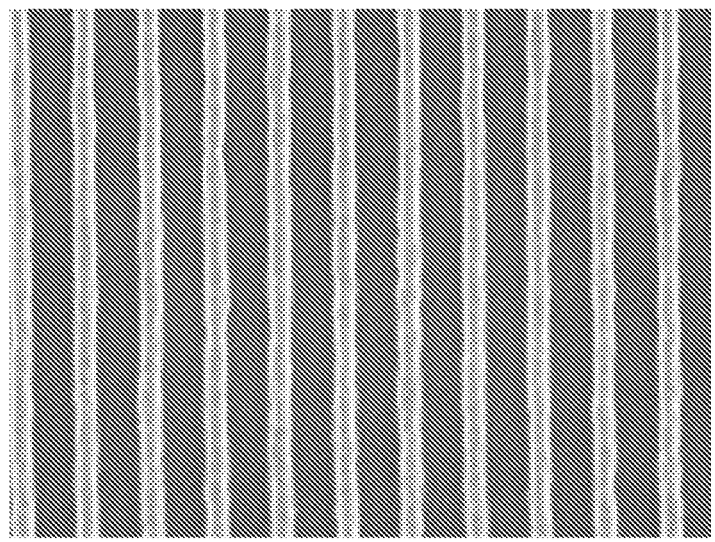
FIG. 8A is a SEM micrograph of the treated photoresist pattern with a pitch of 100 nm formed by a 193 nm immersion stepper of Example 3 followed by trimming steps.
Figure 8B:
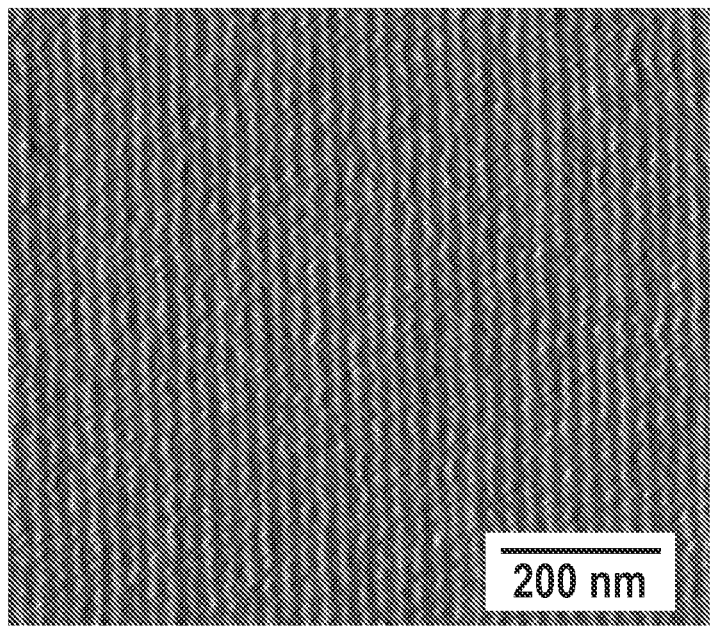
FIG. 8B is a SEM micrograph of the frequency-quadrupled pattern of PS domains formed by the directed self-assembly of PS-b-PMMA on the sparse chemical pattern of Example 3 after oxygen plasma etching.

A commercial 193 nm positive-tone photoresist (JSR AR2928JN) was disposed on a substrate comprising a silicon wafer bottom layer and a 35 nm thick silicon-containing anti-reflection coating (SiARC) (Shin-Etsu A940) as described for Example 1. The photoresist layer was given a post-apply bake at 120° C. for 60 sec. A layer of JSR TCX-041 topcoat was spun cast on the photoresist and subjected to a post-apply bake at 90° C. for 60 sec. The resulting film stack was exposed using an 193 nm immersion stepper (ASML TwinScan1700i) using water as an immersion fluid. The exposed photoresist layer was given a post-expose bake at 115° C. for 60 sec. Afterwards, the photoresist was developed for 60 sec using 0.26N TMAH developer (which also removes the topcoat) to produce a 100 nm pitch patterned photoresist. After development, the photoresist was trimmed (e.g., the width of the photoresist lines was decreased). In the trim process, a layer of JSR TCX-041 was applied over the pattern, baked at 130° C., and removed using 0.26N TMAH developer. The patterned photoresist was then flood exposed (169 mJ/cm$^2$) using a 254 nm Hg/Xe arc lamp (Ushio America UXM-5001MA), baked at 115° C. for 60 sec, and baked at 170° C. for 5 minutes, forming a treated patterned photoresist layer. A SEM micrograph of the treated photoresist pattern is shown in FIG. 8A (brighter lines). A 0.5 wt % solution of an orientation control material, based on total weight of the solution, was prepared by dissolving hydroxyl-terminated poly(styrene-co-methyl methacrylate) random copolymer, P(S-r-MMA) $M_n$=9 kg/mol, in anisole. The solution was spin coated onto the treated photoresist pattern and the resulting structure was baked at 200° C. for 30 minutes to ensure adequate grafting of the P(S-r-MMA) to the surface of the anti-reflection layer. The treated photoresist was removed using a rinse of 0.26N TMAH developer to reveal surfaces of the anti-reflection layer. The excess hydroxyl-terminated P(S-r-MMA) was removed by rinsing with anisole, forming a chemical pre-pattern wherein the revealed surfaces of the anti-reflection layer (and any residual photoresist thereon) serve as pinning regions for block copolymer self-assembly. An anisole solution was prepared containing 1.5 wt % PS-b-PMMA (22k-22k) block copolymer, based on total weight of the solution. The block copolymer solution was spin coated on the chemical pre-pattern and annealed at 240° C. for 5 minutes. Part of the PMMA domains locate on the pinning regions of the chemical pre-pattern and results in a layer of alternating perpendicularly-oriented lamellar PS/PMMA domains aligned to the pinning region. FIG. 8B is an AFM phase image of the resulting frequency quadrupling of PS/PMMA domains. PMMA is brighter in both height and phase image. The pitch of PMMA domains is 25 nm.

Example 4

Figure 9A:
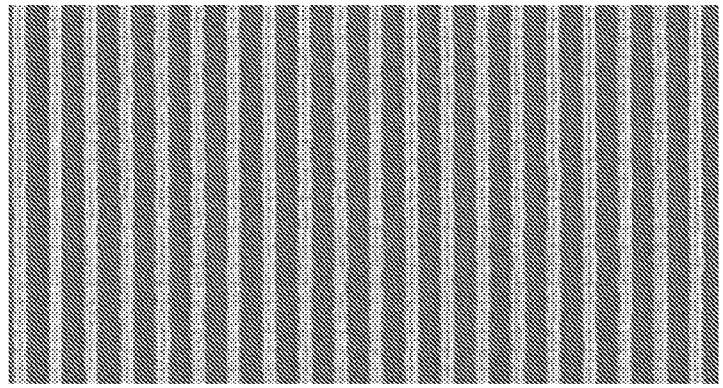
FIG. 9A is an SEM micrograph of the treated photoresist pattern with a pitch of 100 nm formed by a 193 nm immersion stepper of Example 4 followed by trimming steps.
Figures 9B, 9C:
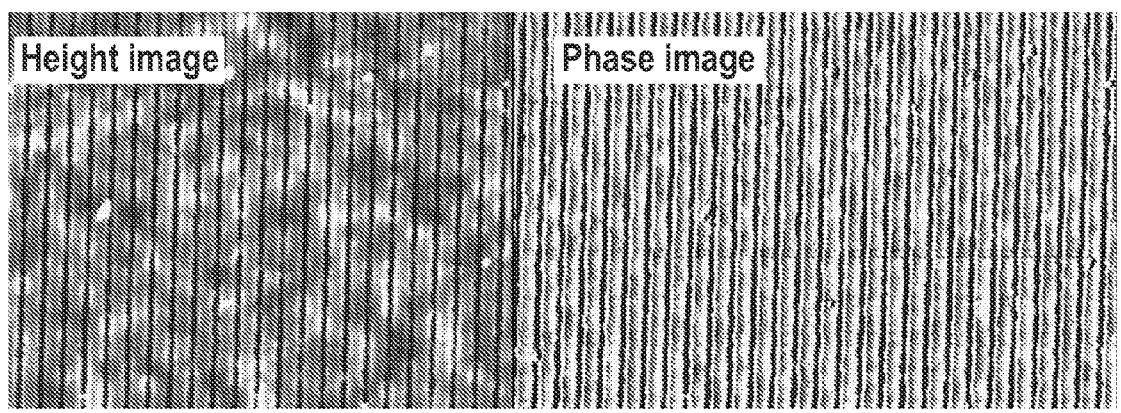
FIGS. 9B and 9C are AFM height and phase images, respectively, of the of the layered structure of Example 4, after disposing an orientation control layer containing P(S-r-MA-r-EDCPMA) on the treated photoresist pattern (the treated photoresist pattern was previously flood exposed and then baked at 115° C. for 60 seconds and 170° C. for 5 minutes), and subsequently disposing an SA layer of PS-b-PMMA on the orientation control layer. The treated photoresist was then removed with TMAH developer. The images show the resulting chemical pattern consisting of regions of orientation control material and narrow trenches (dark lines) where the photoresist has been removed.
Figures 9D, 9E:
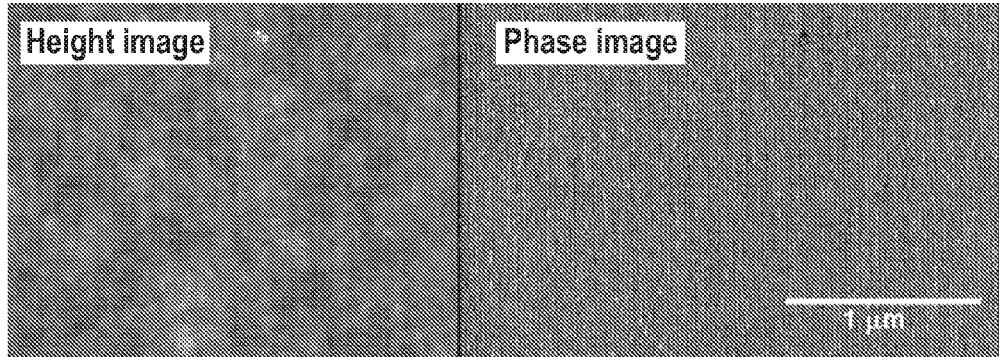
FIGS. 9D and 9E are AFM height and phase images, respectively, of the of the frequency quadrupled pattern formed by the directed self-assembly of PS-b-PMMA on the sparse chemical pattern of Example 4. PMMA domains are brighter in both height and phase images.
Figure 9F:
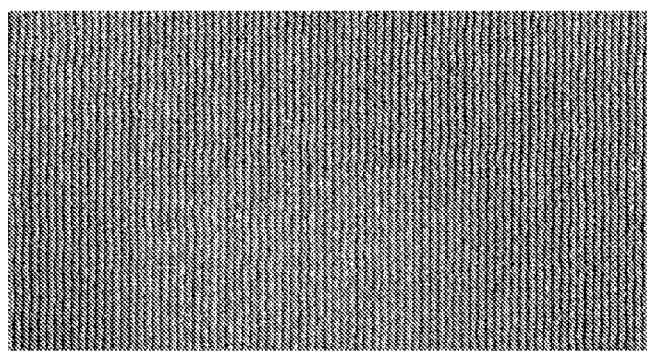
FIG. 9F is an SEM micrograph showing the line-space pattern of PS domains of 25 nm pitch after etching with oxygen plasma in Example 4.

A commercial 193 nm positive-tone photoresist (JSR AR2928JN) was disposed on a substrate comprising a silicon wafer bottom layer and a 35 nm thick silicon-containing anti-reflection coating (Shin-Etsu A940) as described for Example 1. The photoresist layer was given a post-apply bake at 120° C. for 60 sec. A layer of JSR TCX-041 topcoat was spun cast on the photoresist and subjected to a post-apply bake at 90° C. for 60 sec. The resulting film stack was exposed using an 193 nm immersion stepper (ASML TwinScan1700i) using water as an immersion fluid. The exposed photoresist layer was given a post-expose bake at 115° C. for 60 sec. Afterwards, the photoresist was developed for 60 sec using 0.26N TMAH developer (which also removes the topcoat) to produce a 100 nm pitch patterned photoresist. After development, the photoresist was trimmed (e.g., the width of the photoresist lines was decreased). In the trim process, a layer of JSR TCX-041 was applied over the pattern, baked at 130° C., and removed using 0.26N TMAH developer. The resulting 100 nm pitch patterned photoresist (FIG. 9A) was then flood exposed (169 mJ/cm$^2$) using a 254 nm Hg/Xe arc lamp (Ushio America UXM-5001MA), baked at 115° C. for 60 sec, and baked at 170° C. for 5 minutes, forming a treated photoresist layer. A PGMEA solution was prepared containing, based on total weight of the solution, 1 wt % of an orientation control material, poly(styrene-co-methyl methacrylate-co-epoxydicyclopentadiene methacrylate) random copolymer, P(S-r-MMA-r-EDCPMA), mole ratio of S:MMA:EDCPMA=57:39:4, and 0.1 wt % N-phthalimide triflate (PIT) thermal acid generator. The dry weight ratio of PIT:P(S-r-MMA-r-EDCPMA) was 1:10. The solution was spin coated onto the treated photoresist layer, and the resulting structure was baked at 170° C. for 2 minutes to cross-link the orientation control material. The treated photoresist was removed by rinsing the structure with 0.26N TMAH developer, forming a linear chemical pre-pattern in which the revealed surfaces of the anti-reflection layer (and any residual photoresist thereon) serve as pinning regions for block copolymer self-assembly. FIGS. 9B and 9C are AFM height (left) and phase (right) images of the chemical pre-pattern (the pinning regions are shown as darker lines). The cross-linked orientation control material (brighter lines) is about 10 nm in thickness. A PGMEA solution was prepared containing 1.5 wt % PS-b-PMMA (22k-22k) block copolymer, based on total weight of the solution. The block copolymer solution was spin coated on the chemical pre-pattern and annealed at 240° C. for 5 minutes. Some of the PMMA domains locate on the pinning regions of the chemical pre-pattern, resulting in a layer of alternating perpendicularly-oriented lamellar PS and PMMA domains aligned to the pinning region. FIGS. 9D and 9E are AFM height and phase images of the resulting frequency quadrupling of PS/PMMA domains. PMMA is brighter in both height and phase images. The pitch of PMMA domains is 25 nm. The SEM micrograph (FIG. 9F) shows the line-space pattern of PS domains of 25 nm pitch after removal of the PMMA domains by etching with oxygen plasma.

Example 5

Figures 10A, 10B, 10C:
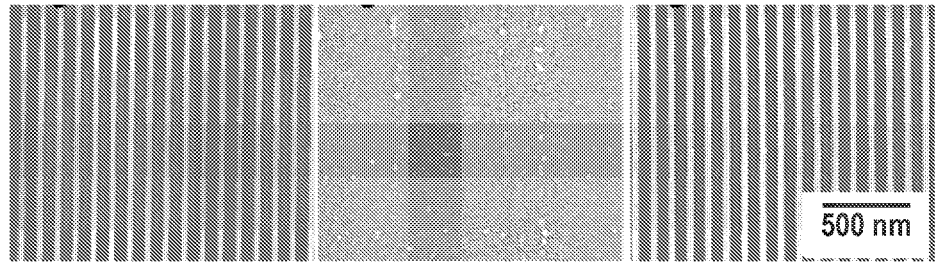
FIG. 10A is an SEM image of the treated photoresist pattern of Example 5.
FIG. 10B is an SEM image of the treated photoresist pattern of Example 5, after baking the treated photoresist pattern at 170° C. for 1 minute, and then rinsing with PGMEA.
FIG. 10C is an SEM image of the treated photoresist pattern of Example 5, after baking the treated photoresist pattern at 170° C. for 5 minutes, and then rinsing with PGMEA.
Figures 10D, 10E:
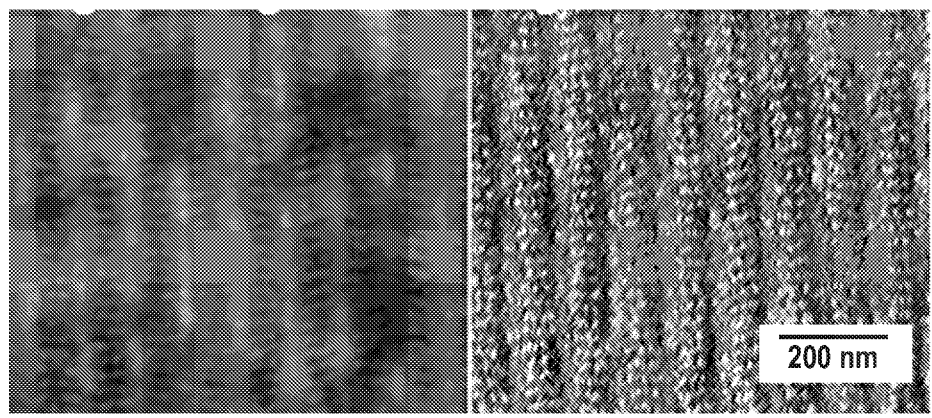
FIGS. 10D and 10E are AFM height and phase images, respectively, of the layered structure of Example 5, after disposing an orientation control material P(S-r-EDCPMA) on the treated photoresist pattern baked at 170° C. for 5 minutes, and subsequently disposing the SA material (PS-b-PMMA) on the orientation control material. The images show the self-assembled PMMA domains perpendicularly aligned to the grating patterns of the treated photoresist pattern.

As in Examples 3 and 4, a photoresist pattern having a grating pattern with a pitch of 100 nm was made by pattern-wise exposing a layer of 193 nm photoresist layer (ARX 2928JN from JSR) disposed on an anti-reflection coating (A940 from Shin Etsu) as described for Example 1. The photoresist layer was given a post-apply bake at 120° C. for 60 sec. A layer of JSR TCX-041 topcoat was spun cast on the photoresist and subjected to a post-apply bake at 90° C. for 60 sec. The resulting film stack was exposed using an 193 nm immersion stepper (ASML TwinScan1700i) using water as an immersion fluid. The exposed photoresist layer was given a post-expose bake at 115° C. for 60 sec. Afterwards, the photoresist was developed for 60 sec using 0.26N TMAH developer (which also removes the topcoat) to produce a 100 nm pitch patterned photoresist. After development, the photoresist was trimmed (e.g., the width of the photoresist lines was decreased). In the trim process, a layer of JSR TCX-041 was applied over the pattern, baked at 130° C., and removed using 0.26N TMAH developer. Then the initial layer was given a flood exposure of 130 mJ/cm$^2$ using a broad band DUV source (a Hg/Xe 500W short-arc lamp (UXM-501MA) from Ushio America) to deprotect the photoresist, followed by a post-exposure bake at 115° C. for 1 minute. An SEM image of the resulting photoresist pattern is shown in FIG. 10A (brighter lines). The photoresist pattern was then baked at 170° C. (one sample for 1 minute, another sample for 5 minutes), followed by a rinse with PGMEA. For the sample baked at 170° C. for 1 minute, almost no treated photoresist pattern was observed after the PGMEA rinse (FIG. 10B, SEM image). For the second sample baked for 5 minutes at 170° C., the treated photoresist pattern was intact after the PGMEA rinse (FIG. 10C, SEM image), allowing for a subsequent layer of materials to be cast on the treated photoresist. An orientation control layer comprising P(S-r-EDCPMA) random copolymer and thermal acid generator (TAG) (weight ratio of P(S-r-EDCPMA): TAG=10:1), was then cast from PGMEA on the second sample of treated photoresist pattern. The P(S-r-EDCPMA) was cross-linked by baking at 130° C. for 1 minute and baking at 200° C. for 2 minutes to form a topographical prepattern for graphoepitaxy. A 1.5 wt % anisole solution, was prepared of block copolymer PS-b-PMMA (22k-22k), based on total weight of the solution. The solution was spin coated on the topographical prepattern. The resulting SA layer was baked at 240° C. for 2 minutes to generate self-assembled lamellar PMMA domains perpendicularly aligned to the treated photoresist pattern as well as the long axis of the grating, as shown in AFM height image (FIG. 10D) and AFM phase image of FIG. 10E.

Example 6

Figure 11A:
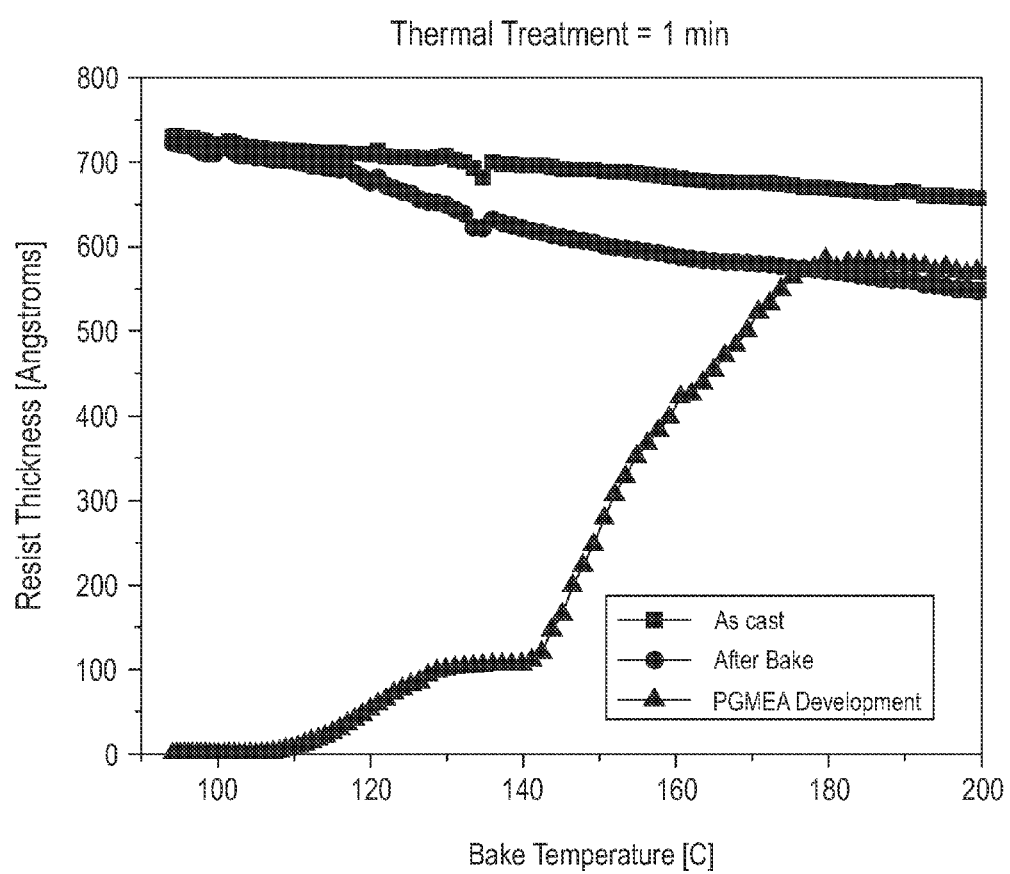
FIGS. 11A and 11B show the impact of a 1 minute and 5 minute thermal treatment on the thickness of exposed photoresist prior to and after a development process using PGMEA (Example 6). Treating the photoresist at higher bake temperatures is sufficient to render it insoluble in PGMEA.
Figure 11B:
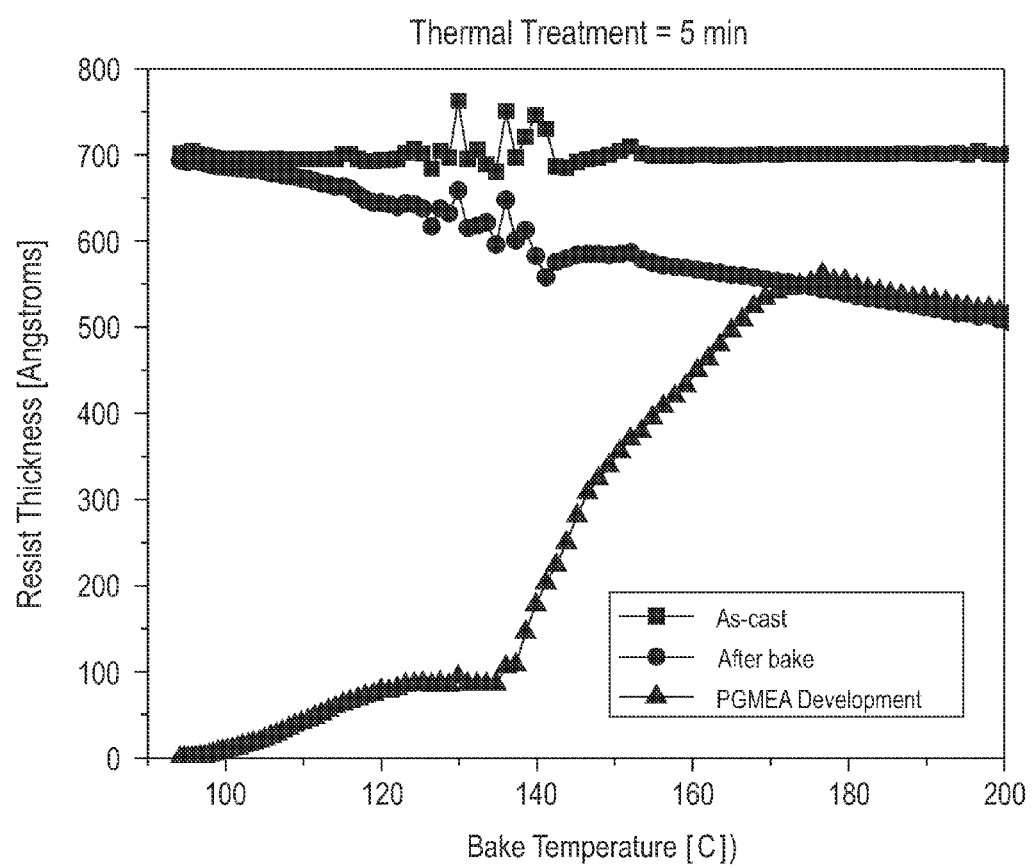

This experimental series demonstrates the effect of bake temperature for two different bake times (1 min and 5 min) on the solubility in PGMEA of a flood exposed photoresist layer. A solution comprising a 193 nm photoresist (JSR AR2928JN) was spin coated (3000 rpm for 30 s) onto a substrate having an anti-reflection top layer coating (780 angstroms of ARC-29A, Brewer Science) on silicon. This is designated the "As-cast" layer. The thickness of the photoresist layer was measured at 125 points across the "As-cast" wafer. The photoresist layer was given a post-application bake (PAB) for 60 sec at 120° C. The photoresist layer was then flood exposed with a deep-UV mercury arc lamp (USHIO UXM-501MA) at a dose of 150 mJ/cm$^2$. The exposed wafer was then given a post-exposure bake (PEB) for 60 sec at 115° C. The wafer was then subjected to a thermal gradient heat treatment at temperatures ranging from 50° C. to 200° C. for 1 minute or 5 minutes using a thermal gradient hotplate. The thickness of the photoresist layer was measured at 125 points across the "After Bake" wafer and each thickness measurement was correlated with the corresponding temperature of the thermal gradient. The photoresist thickness decreases in roughly a linear relationship to the bake temperature likely due to evaporation (i.e., outgas sing) of deprotection fragments and densification of the photoresist film. The results are shown as curves labeled "As-cast" and "After Bake" in FIGS. 11A and 11B. An "After Bake" wafer was developed in PGMEA for 60 sec and the remaining photoresist thickness was re-measured in the same manner. The results are shown as "PGMEA development" in FIGS. 11A and 11B. The results show that at a gradient temperature of about 180° C. and a heating time of 1 minute, no additional thickness loss in the photoresist layer is observed as a result of the PGMEA development process, which indicates that the film has become fully insoluble in PGMEA. Similarly, the exposed photoresist layer became insoluble in PGMEA at a treatment temperature of about 170° C. to 175° C. for a heating time of 5 minutes.

The above results show that the solubility of the exposed photoresist layer can be significantly reduced using a thermal treatment of 1 and 5 minutes at temperatures ranging from 90° C. to 200° C. Appropriate temperature/time conditions can be determined where no thickness change occurs between the "After Bake" (circles in FIGS. 11A and 11B) and "PGMEA development" curves (triangles in FIGS. 11A and 11B). The optimal thermal treatment conditions for temperature and heating time can depend on a number of factors including the exposure dosage, the photoresist formulation, and the irradiation type (spectral bandwidth and intensity). In general, a thermal treatment at higher temperature allows for shorter heating times, whereas lower temperatures require longer heating times. These data are for bulk films and actual conditions necessary to render the photoresist insoluble in PGMEA may vary depending upon the size of the features being patterned; however, the thermal treatment results of Example 6 have, in general, been found to be predictive of the PGMEA solubility of a developed photoresist layer which has been given a post-development exposure and/or similar thermal treatment.

Example 7

Figures 12A, 12B, 12C:
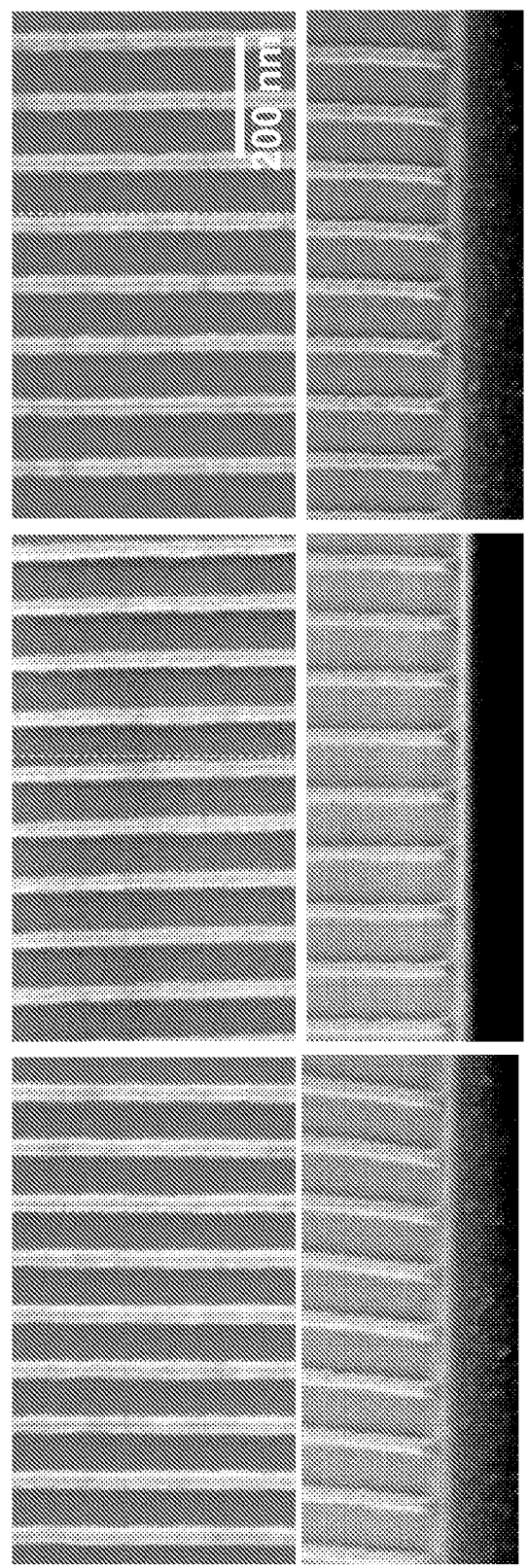
FIGS. 12A, 12B and 12C are SEM image pairs, plane-view (top) and cross-section (bottom), of the layered structure of Example 7 at several stages of the process.

Experiments on the effect of hardening process on the photoresist profiles are shown in FIG. 12. A commercial 193 nm positive-tone photoresist (JSR AR2928JN) was disposed on a substrate comprising a silicon wafer bottom layer and a 35 nm thick silicon-containing anti-reflection coating (Shin-Etsu A940) as described for Example 1. The photoresist layer was given a post-apply bake at 120° C. for 60 sec. A layer of JSR TCX-041 topcoat was spun cast on the photoresist and subjected to a post-apply bake at 90° C. for 60 sec. The resulting film stack was exposed using an 193 nm immersion stepper (ASML TwinScan1700i) using water as an immersion fluid. The exposed photoresist layer was given a post-expose bake at 115° C. for 60 sec. Afterwards, the photoresist was developed for 60 sec using 0.26N TMAH developer (which also removes the topcoat) to produce a 100 nm pitch patterned photoresist. After development, the photoresist was trimmed (e.g., the width of the photoresist lines was decreased). In the trim process, a layer of JSR TCX-041 was applied over the pattern, baked at 130° C., and removed using 0.26N TMAH developer. The resulting 100 nm pitch patterned photoresist was then flood exposed (50 mJ/cm$^2$) using a 254 nm Hg/Xe arc lamp (Ushio America UXM-5001MA). After exposure, samples were subjected to three different thermal treatments to determine the impact of the thermal treatment conditions on the resulting profiles of hardened photoresist patterns. FIG. 12A shows the SEM plane-view and cross-section images of a sample subjected to a 60 sec bake at 115° C. The averaged line width is 31.2 nm and the line-edge roughness is 3.2 nm. FIG. 12B shows the SEM plane-view and cross-section images of a sample subjected to a 60 sec bake at 115° C. and a 120 sec bake at 185° C. The averaged line width is 30.7 nm and the line-edge roughness is 3.6 nm. FIG. 12C shows the SEM plane-view and cross-section images of a sample subjected to a 60 sec bake at 115° C., a 120 sec bake at 185° C., and a 120 sec bake at 190° C. The averaged line width is 29.5 nm and the line-edge roughness is 3.0 nm. The relatively small difference in lateral dimension as well as vertical dimension among three samples indicates that almost no photoresist reflow is induced by the bake conditions associated with the thermal treatment (185° C./120 s) and the formation of the bound orientation control layer (190° C./120 s).

Example 8

Figure 13A:
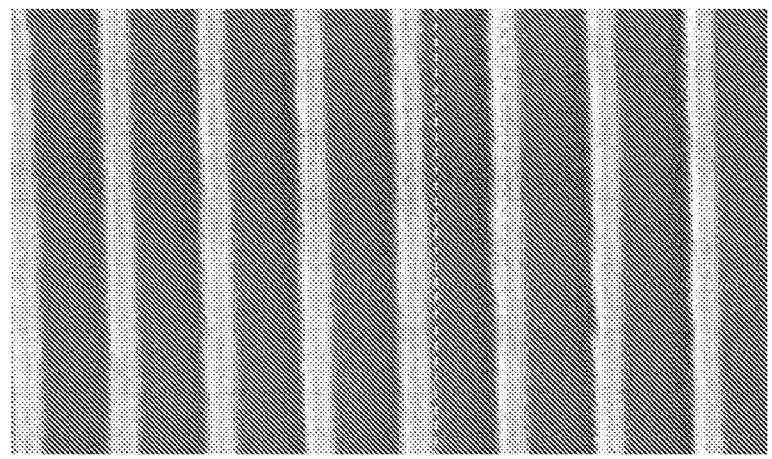
FIGS. 13A, 13B and 13C are SEM plane-view images respectively, of the layered structure of Example 8.
Figure 13B:
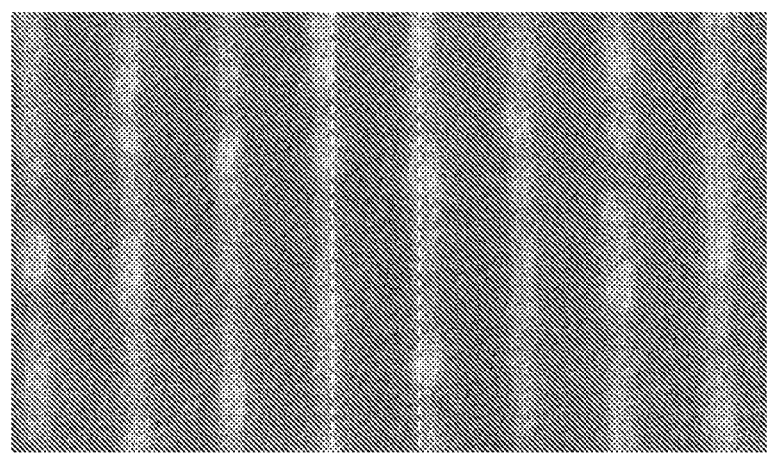
Figure 13C:
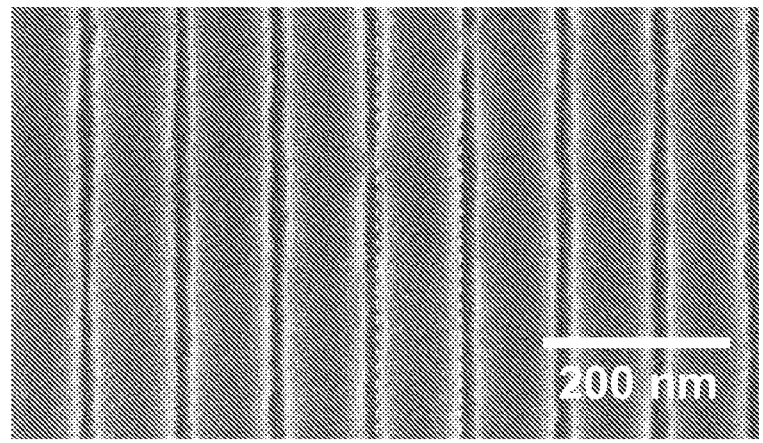
Figure 13D:
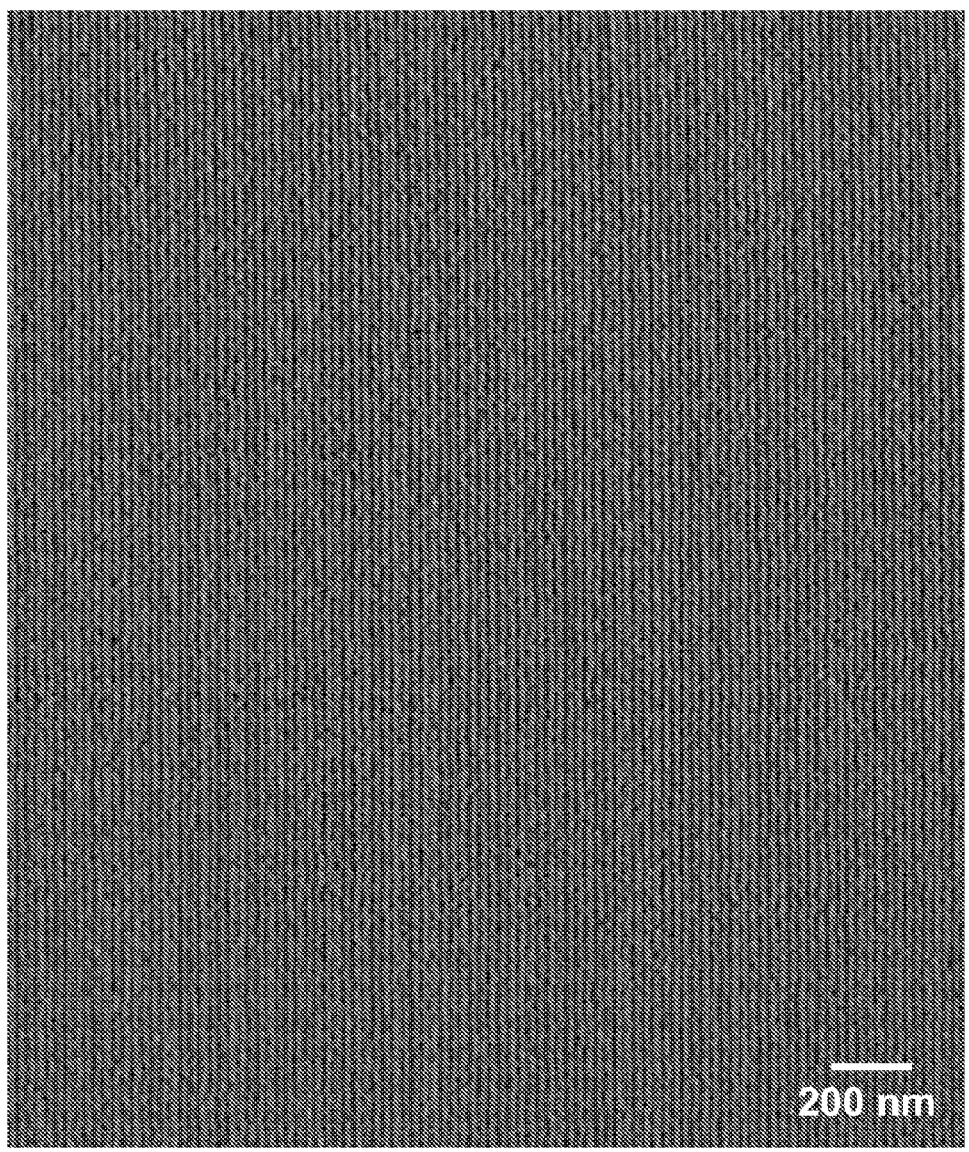
FIG. 13D is an AFM phase image of PS-b-PMMA on the chemical pre-pattern of Example 8.

A commercial 193 nm positive-tone photoresist (JSR AR2928JN) was disposed on a substrate comprising a silicon wafer bottom layer and a 35 nm thick silicon-containing anti-reflection coating (Shin-Etsu A940) as described for Example 1. The photoresist layer was given a post-apply bake at 120° C. for 60 sec. A layer of JSR TCX-041 topcoat was spun cast on the photoresist and subjected to a post-apply bake at 90° C. for 60 sec. The resulting film stack was exposed using an 193 nm immersion stepper (ASML TwinScan1700i) using water as an immersion fluid. The exposed photoresist layer was given a post-expose bake at 115° C. for 60 sec. Afterwards, the photoresist was developed for 60 sec using 0.26N TMAH developer (which also removes the topcoat) to produce a 100 nm pitch patterned photoresist. After development, the photoresist was trimmed (e.g., the width of the photoresist lines was decreased). In the trim process, a layer of JSR TCX-041 was applied over the pattern, baked at 130° C., and removed using 0.26N TMAH developer. The resulting 100 nm pitch patterned photoresist (FIG. 9A) was then flood exposed (169 mJ/cm$^2$) using a 254 nm Hg/Xe arc lamp (Ushio America UXM-5001MA), baked at 115° C. for 60 sec, and baked at 185° C. for 2 minutes, forming a treated photoresist layer. The SEM image of the treated photoresist is shown in FIG. 13A. A PGMEA solution was prepared containing, based on total weight of the solution, 1 wt. % of an orientation control material, poly(styrene-co-methyl methacrylate-co-epoxydicyclopentadiene methacrylate) random copolymer, P(S-r-MMA-r-GMA), mole ratio of S:MMA:GMA=56:42:2, and 0.1 wt. % N-phthalimide triflate (PIT) thermal acid generator. The dry weight ratio of PIT: P(S-r-MMA-r-GMA) was 1:10. The solution was spin coated onto the treated photoresist layer, and the resulting structure was baked at 190° C. for 2 minutes to cross-link the orientation control material. FIG. 13B shows the SEM image of crosslinked orientation control material on the treated photoresist. The treated photoresist retains its profile without collapse during the coating and baking of the orientation control material. The treated photoresist was removed by rinsing the structure with 0.26N TMAH developer, forming a linear chemical pre-pattern, having pinning regions comprising revealed surfaces of the anti-reflection layer and any residual photoresist thereon. SEM image of chemical pre-pattern (FIG. 13C) shows orientation control materials (brighter wide stripe) stays on the substrates while the photoresist is removed. A PGMEA solution was prepared containing 2 wt % PS-b-PMMA (22k-22k) block copolymer, based on total weight of the solution. The block copolymer solution was spin coated on the chemical pre-pattern and annealed at 240° C. for 5 minutes. Some of the PMMA domains locate on the pinning regions of the chemical pre-pattern, resulting in a layer of alternating perpendicularly-oriented lamellar PS and PMMA domains aligned to the pinning region. FIG. 13D is an AFM phase image of the resulting frequency quadrupling by the PS/PMMA domains. PMMA is brighter in the AFM phase image. The pitch of the PMMA domains is 25 nm.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless stated otherwise.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:
1. A method of forming a layered structure comprising a self-assembled material, comprising:
  disposing a non-crosslinking photoresist layer on a substrate; pattern-wise exposing the photoresist layer to first radiation; optionally heating the exposed photoresist layer; developing the exposed photoresist layer in a first development process with an aqueous alkaline developer, forming an initial patterned photoresist layer;
  treating the initial patterned photoresist layer photochemically, thermally and/or chemically, thereby forming a treated patterned photoresist layer comprising non-crosslinked treated photoresist disposed on a first substrate surface;
  casting a solution of an orientation control material in a first solvent on the treated patterned photoresist layer, and removing the first solvent, thereby forming an orientation control layer, wherein the orientation control material supports an orientation of a phase-separated domain of the self-assembled material disposed thereon;
  heating the orientation control layer to effectively bind a portion of the orientation control material to a second substrate surface;
  removing at least a portion of the treated photoresist and, optionally, any non-bound orientation control material in a second development process, thereby forming a pre-pattern for self-assembly;
  optionally heating the pre-pattern;
  casting a solution of a material capable of self-assembly dissolved in a second solvent on the pre-pattern and removing the second solvent; and allowing the casted material to self-assemble with optional heating and/or annealing, thereby forming the layered structure comprising the self-assembled material.

2. The method of claim 1, wherein substantially all of the treated photoresist is removed.

3. The method of claim 2, wherein treating comprises flood exposing the initial patterned photoresist layer with ultraviolet radiation at a dose of 1 to 200 mJ/cm$^2$.

4. The method of claim 1, wherein treating comprises exposing the initial patterned photoresist layer to second radiation at a dose of 1 to 200 mJ/cm$^2$.

5. The method of claim 1, wherein treating comprises one or more thermal treatments of the initial patterned photoresist layer, each independently selected from temperatures of from 60° C. to 300° C. and heating times of at least 1 sec.

6. The method of claim 1, wherein treating comprises flood exposing the initial patterned photoresist layer with ultraviolet radiation at a dose of 1 to 200 mJ/cm$^2$, and heating the flood exposed layer at 60° C. to 300° C. for at least 1 sec to form the treated patterned photoresist layer.

7. The method of claim 1, wherein the second development process comprises dissolving the treated photoresist with the aqueous alkaline developer or another developer, and optionally dissolving any non-bound orientation control material in the first solvent or another solvent.

8. The method of claim 1, wherein the non-crosslinking photoresist is a positive-tone photoresist capable of chemical amplification.

9. The method of claim 1, wherein heating the orientation control layer causes a portion of the orientation control material to be grafted to the second substrate surface.

10. The method of claim 1, further comprising selectively removing a domain of the self-assembled material in the presence of a second domain of the self-assembled material, thereby forming a relief pattern.

11. The method of claim 10, wherein the relief pattern comprises a pattern of openings having a higher spatial frequency than the pre-pattern.

12. The method of claim 10, further comprising transferring the relief pattern to the substrate.

13. The method of claim 1, further comprising narrowing a dimension of the patterned photoresist layer before treating the initial patterned photoresist layer.

14. The method of claim 1, wherein pattern-wise exposing the photoresist layer is performed using immersion lithography.

15. The method of claim 1, wherein the material capable of self-assembly comprises a mixture of immiscible polymers.

16. The method of claim 1, wherein the material capable of self-assembly comprises a block polymer selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth) acrylate), poly(methyl methacrylate-b-t-butyl methacrylate), poly(ethylene oxide-b-propylene oxide), poly(styrene-b-tetrahydrofuran), poly(styrene-b-dimethylsiloxane), poly(styrene-b-ferrocenyldimethylsilane), poly(styrene-b-isoprene-b-ethylene oxide), poly(styrene-b-isoprene-b-methyl methacrylate), poly(styrene-b-ferrocendimethylsilane-b-isoprene), and a combination comprising at least one of the foregoing block copolymers.

17. The method of claim 1 wherein the solvent suitable for casting an orientation control material is selected from the group consisting of anisole, ethylene glycol, propylene glycol, 4-methyl-2-pentanol, n-butyl acetate, PGMEA, and mixtures thereof.

18. The method of claim 1, wherein the orientation control material is a polymer comprising repeating units derived from epoxydicyclopentadiene methacrylate.

19. The method of claim 1, wherein the orientation control material is a hydroxyl-terminated polymer.

20. The method of claim 1, wherein the orientation control material is selected from the group consisting of poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane), poly(alpha-methyl styrene-co-methyl methacrylate), poly(methyl glutarimide), self-assembled monolayers, hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate), and combinations thereof.

21. A method of forming a layered structure comprising a self-assembled polymer, the method comprising:
  forming a photoresist layer comprising a non-crosslinking positive-tone photoresist capable of chemical amplification on a substrate; pattern-wise exposing the photoresist layer to first radiation; optionally heating the exposed photoresist layer; developing the exposed photoresist layer with an aqueous alkaline developer, thereby forming an initial patterned photoresist layer;
  exposing the initial patterned photoresist layer with ultraviolet radiation at a dose of 1 to 200 mJ/cm$^2$; heating the exposed initial patterned photoresist layer at 80° C. to 250° C. for at least 1 sec, thereby forming a treated patterned photoresist layer comprising non-crosslinked treated photoresist disposed on a first substrate surface;
  casting a solution of an orientation control material in a first solvent on the treated patterned photoresist layer and removing the first solvent, thereby forming an orientation control layer, wherein the orientation control material comprises repeating units derived from epoxydicyclopentadiene methacrylate or glycidyl methacrylate, wherein the orientation control material supports an orientation of a phase-separated domain of the self-assembled polymer disposed thereon;
  heating the orientation control layer to effectively graft a portion of the orientation control material to a second substrate surface;
  removing at least a portion of the treated photoresist using the aqueous alkaline developer or another aqueous alkaline developer, thereby forming a pre-pattern for self-assembly;
  optionally, heating any remaining treated photoresist of the pre-pattern;
  optionally, removing from the pre-pattern any non-grafted orientation control material using the first solvent or another solvent;
  optionally, heating the pre-pattern;
  casting a solution comprising a polymer capable of self-assembly dissolved in a second solvent on the pre-pattern and removing the second solvent; and allowing the casted polymer to self-assemble while optionally heating and/or annealing the casted polymer, thereby forming the layered structure comprising the self-assembled polymer.

22. The method of claim 21, wherein substantially all of the treated photoresist is removed.

23. The method of claim 21, wherein the orientation control material is derived from a hydroxyl terminated polymer.

24. The method of claim 21, wherein any non-grafted orientation control material is removed prior to removing at least a portion of the treated photoresist.

25. The method of claim 21, further comprising decreasing a dimension of the initial patterned photoresist layer before treating the initial patterned photoresist layer.

26. A method for creating oriented and aligned patterns from self-assembled polymers on a substrate surface that includes chemical patterns, comprising:
    forming a layer of a positive-tone photoresist on a substrate; pattern-wise exposing the photoresist; optionally baking the exposed photoresist; developing by selectively removing photoresist in the exposed regions; treating any remaining photoresist to reduce solubility of the treated photoresist in a first solvent suitable for dissolving a given orientation control material, wherein the orientation control material supports an orientation of a phase-separated domain of the self-assembled polymers disposed thereon;
    casting a solution of the given orientation control material dissolved in the first solvent on the treated photoresist and removing the first solvent, thereby forming a layer of orientation control material on a substrate surface;
    grafting a layer of orientation control material to the substrate surface not covered by photoresist;
    removing a portion of the treated photoresist, thereby forming pinning regions having a height less than a height of the treated photoresist;
    optionally removing non-grafted orientation control material;
    optionally baking the substrate;
    applying a layer of self-assembling polymers over the orientation control material and the pinning regions, and allowing the self-assembling polymers to self-assemble; and
    optionally annealing the self-assembled polymers.

27. The method of claim 26, further comprising selectively removing a domain of the self-assembled polymers, thereby forming a relief pattern.

28. The method of claim 27, further comprising transferring the pattern to the underlying substrate.

29. A method of forming a layered structure comprising a self-assembled material, the method comprising:
    forming a photoresist layer comprising a non-crosslinking positive-tone photoresist capable of chemical amplification on a substrate; pattern-wise exposing the photoresist layer to first radiation; optionally heating the exposed photoresist layer; developing the exposed photoresist layer in a first development process with a non-alkaline developer, thereby forming a negative-tone initial patterned photoresist layer;
    treating the initial patterned photoresist layer photochemically, thermally and/or chemically, thereby forming a treated patterned photoresist layer comprising non-crosslinked treated photoresist disposed on a first substrate surface;
    casting a solution of an orientation control material in a first solvent on the treated patterned photoresist layer, and removing the first solvent, thereby forming an orientation control layer, wherein the orientation control material supports an orientation of a phase-separated domain of the self-assembled material disposed thereon;
    heating the orientation control layer to effectively bind a portion of the orientation control material to a second substrate surface;
    removing at least a portion of the treated photoresist and, optionally, any non-bound orientation control material in a second development process, thereby forming a pre-pattern for self-assembly;
    optionally heating the pre-pattern;
    casting a solution of a material capable of self-assembly dissolved in a second solvent on the pre-pattern and removing the second solvent; and
    allowing the casted material to self-assemble with optional heating and/or annealing, thereby forming the layered structure comprising the self-assembled material.

30. The method of claim 29, wherein substantially all of the treated photoresist is removed in the second development process.

31. The method of claim 29, wherein the orientation control material is derived from a hydroxyl terminated polymer.

32. The method of claim 29, wherein the orientation control material comprises repeating units derived from glycidyl methacrylate or epoxydicyclopentadiene methacrylate.

33. The method of claim 29, further comprising selectively removing a domain of the self-assembled material in the presence a second domain of the self-assembled material, thereby forming a relief pattern.

34. The method of claim 33, further comprising transferring the relief pattern to the substrate.

* * * * *